US012684862B2

(12) United States Patent
Pan et al.

(10) Patent No.: US 12,684,862 B2
(45) Date of Patent: Jul. 14, 2026

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Kuan-Ting Pan, Taipei City (TW); Jia-Chuan You, Taoyuan City (TW); Chia-Hao Chang, Hsinchu City (TW); Kuo-Cheng Chiang, Hsinchu County (TW); Chih-Hao Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 407 days.

(21) Appl. No.: 18/451,137

(22) Filed: Aug. 17, 2023

(65) Prior Publication Data

US 2025/0063808 A1     Feb. 20, 2025

(51) Int. Cl.
| | |
|---|---|
| *H01L 27/088* | (2006.01) |
| *H01L 29/06* | (2006.01) |
| *H01L 29/423* | (2006.01) |
| *H01L 29/66* | (2006.01) |
| *H01L 29/775* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ........... *H10D 84/83* (2025.01); *H10D 30/014* (2025.01); *H10D 30/43* (2025.01); *H10D 30/6735* (2025.01); *H10D 62/121* (2025.01); *H10D 64/017* (2025.01); *H10D 84/0151* (2025.01); *H10D 84/038* (2025.01)

(58) Field of Classification Search
CPC .. H10D 30/014; H10D 30/6735; H10D 30/43; H10D 62/121; H10D 64/0174; H10D 84/0151; H10D 84/0153; H10D 84/833
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |

(Continued)

*Primary Examiner* — John A Bodnar

(74) *Attorney, Agent, or Firm* — WPAT LAW; Anthony King

(57) ABSTRACT

A semiconductor structure includes a first dielectric wall over a substrate, and two metal gate structures disposed at two sides of the first dielectric wall. Each of the metal gate structures includes a plurality of nanosheets stacked over the substrate and separated from each other, a high-k gate dielectric layer covering each of the nanosheets, and a metal layer covering and over the plurality of nanosheets and the high-k gate dielectric layer. The high-k gate dielectric layer of each metal gate structure is disposed between the metal layer of each metal gate structure and the first dielectric wall.

20 Claims, 24 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2023/0019860 A1* | 1/2023 | Ko | ........................ H10D 30/43 |

* cited by examiner

Figures 2, 3:
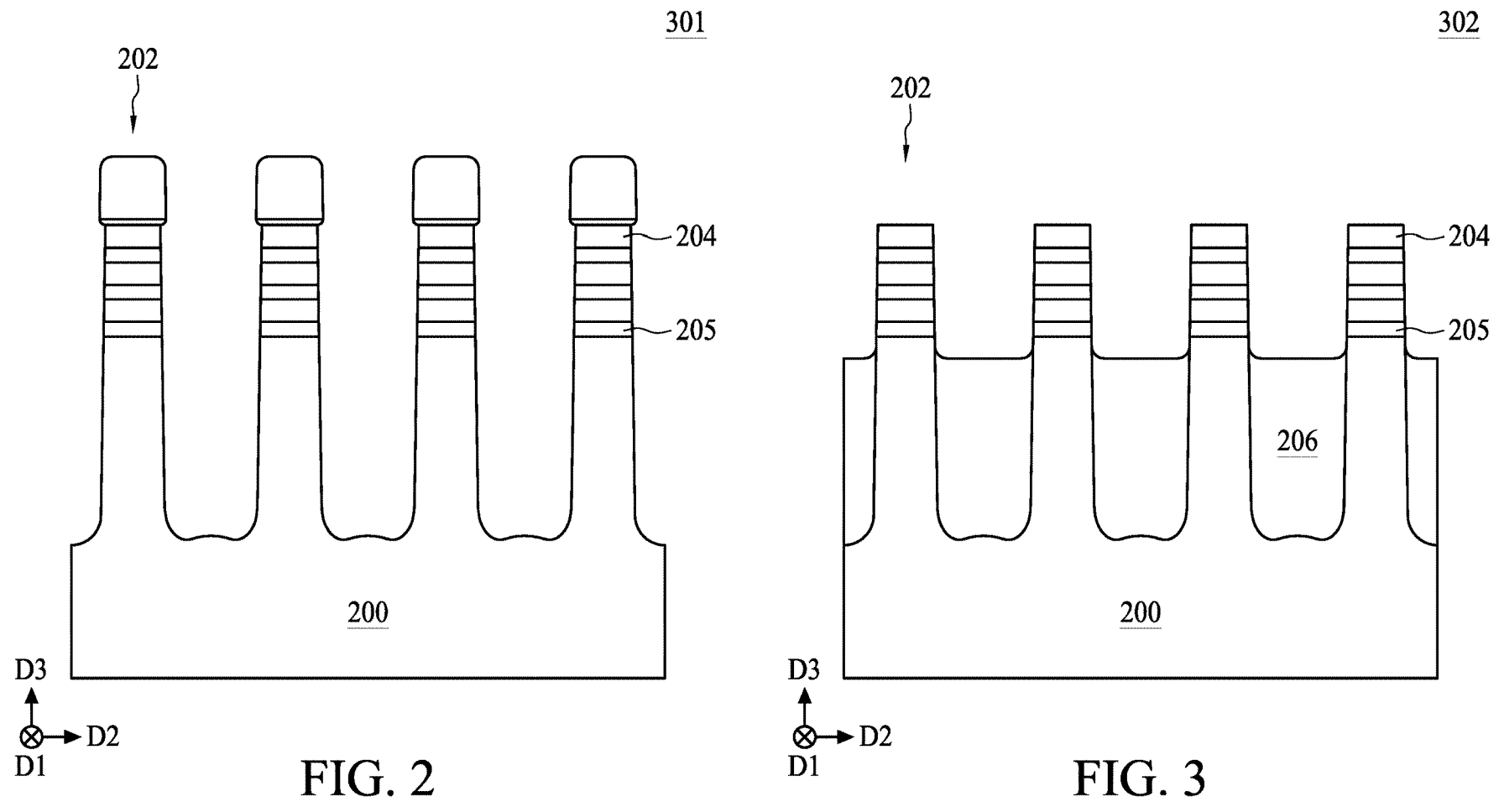

Figures 4, 5:
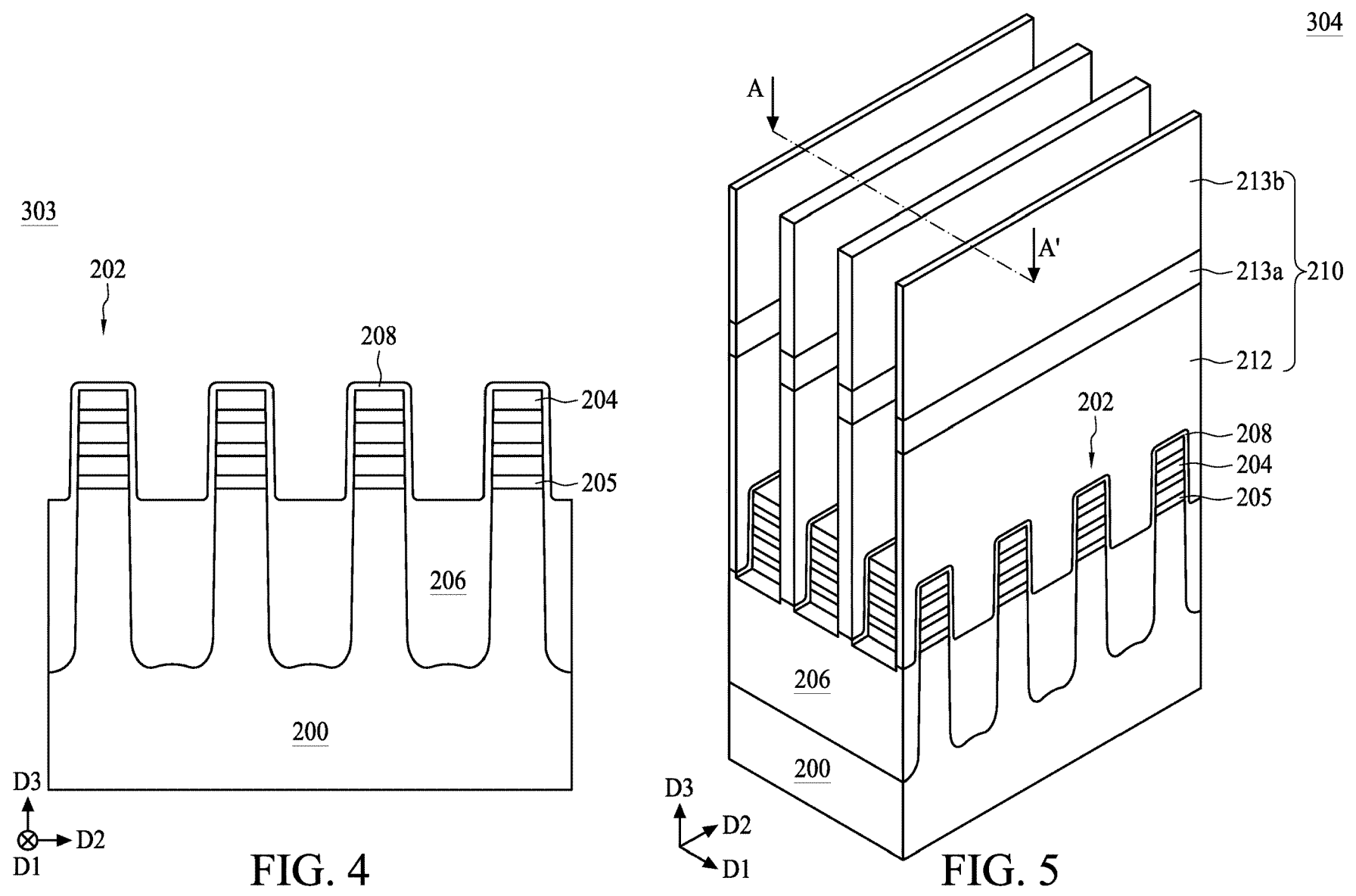

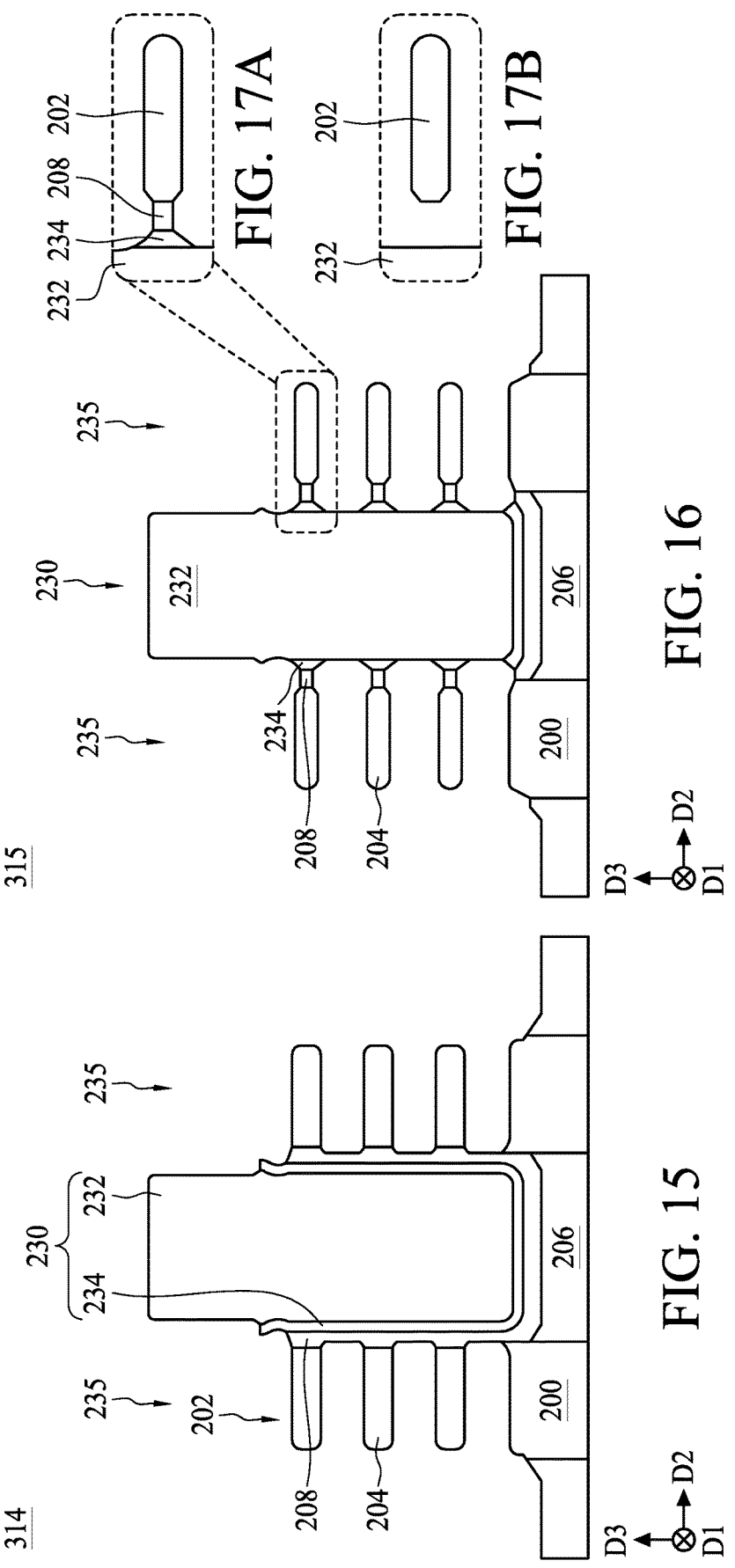

SEMICONDUCTOR STRUCTURE AND METHOD FOR FORMING THE SAME

BACKGROUND

As the semiconductor industry develops smaller and smaller nanoscale products and related processes in pursuit of greater device density, higher performance, and lower costs, challenges of downscaling both design and fabrication have led to development of three-dimensional designs, such as multi-gate field-effect transistors (FET), including a fin FET (FinFET) and a gate-all-around (GAA) FET. In a FinFET, a gate electrode is positioned adjacent to three side surfaces of a channel region with a gate dielectric layer interposed therebetween. Because such gate structure surrounds a fin on three sides, the FinFET essentially has three gates controlling a current through a fin or channel region. However, a fourth side, that is, a bottom part of the channel region, is positioned far away from the gate electrode and thus is not under close gate control. In contrast to a FinFET, a GAA FET includes an arrangement wherein all side surfaces of the channel region are surrounded by the gate electrode, allowing fuller depletion in the channel region and resulting in fewer short-channel effects due to a steeper sub-threshold current swing (SS) and smaller drain-induced barrier lowering (DIBL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 30 are perspective views of a semiconductor structure at various fabrication stages constructed according to aspects of one or more embodiments of the present disclosure.

DETAILED DESCRIPTION

Figure 1:
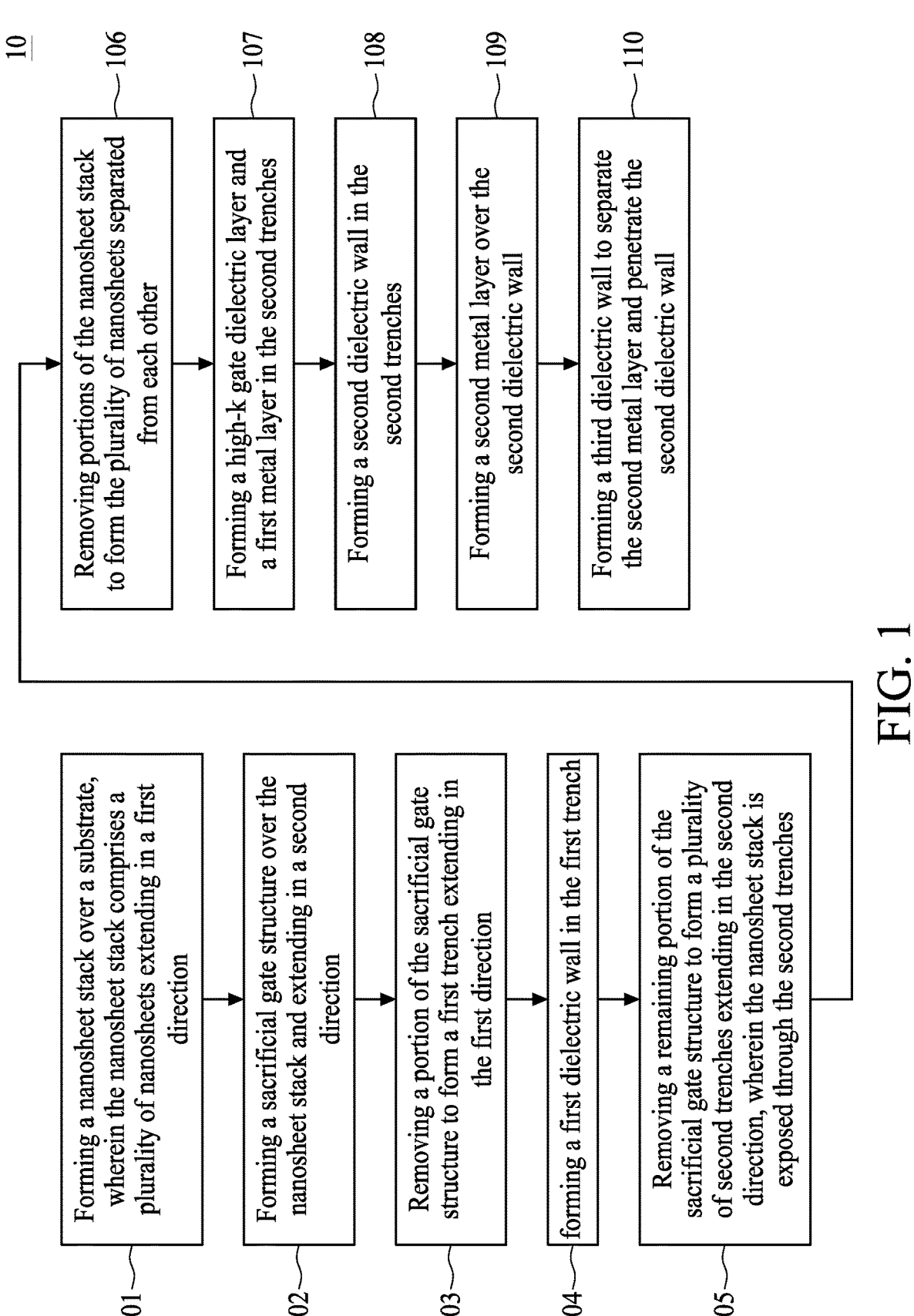
FIG. 1 is a flowchart representing a method for forming a semiconductor structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially." "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The term "nanosheet" refers to atomic, molecular or macromolecular particles typically having a thickness in a range of approximately 1 to 100 nanometers and a width greater than the thickness. For example, the width may be at least twice the thickness, but the disclosure is not limited thereto. Typically, the novel and differentiating properties and functions of nanosheet components are observed or developed at a critical length scale of under 100 nm. In some embodiments, "nanosheet" components can also be referred to as "nano-slab," "nano-ring" or "multi-bridge channel" components.

To continue to provide the desired scaling and increased density for multi-gate devices (e.g., FinFETs and GAA devices) in advanced technology nodes, continued reduction of the cell height and the contacted poly pitch (CPP) (or "gate pitch") is necessary. In some embodiments, a cut metal gate (CMG) region, formed as part of a metal gate isolation process, is defined using a photolithography process. The CMG region can result in poor pattern alignment and degraded critical dimension uniformity (CDU). In other embodiments, a photolithography process is used to perform an active region (OD) isolation process, which can limit device down-scaling.

Further, the photolithography processes used to form the CMG region have issues such as overlay shift and variation in CD. In some comparative embodiments, a distance between the CMG region and a work function metal layer is required in order to avoid damaging the work function metal layer. As a result, establishing optimum cell height and CPP scaling has remained a challenge.

The present disclosure therefore provides a semiconductor structure and a method for forming the same. In some embodiments, the method includes providing dielectric walls that separates metal gate structures prior to forming of the metal gate structures. In some embodiments, the dielectric walls serve as boundaries of a CMG region. In some embodiments, the dielectric walls formed by the method help to mitigate issues of overlay shift and variation in CD. Accordingly, the cell height may be scaled down by approximately 65% to approximately 75%.

The embodiments described herein may be employed in the design and/or fabrication of any type of integrated circuit, or portion thereof, which may include any of a plurality of various devices and/or components such as a static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOS-FETs), complementary metal-oxide-semiconductor (CMOS) transistors, bipolar transistors, high voltage transistors, high frequency transistors, Omega-gate ($\Omega$-gate) devices, or Pi-gate (Π-gate) devices, as well as strained-semiconductor devices, silicon-on-insulator (SOI) devices, partially-depleted SOI (PD-SOI) devices, fully-depleted SOI (FD-SOI) devices, other memory cells, or other devices known in the art. One of ordinary skill may recognize other embodiments of semiconductor devices and/or circuits, including the design and fabrication thereof, which may benefit from aspects of the present disclosure.

FIG. 1 is a flowchart representing a method for forming a semiconductor structure 10 according to aspects of the present disclosure. The method 10 includes a number of operations (101, 102, 103, 104, 105, 106, 107, 108, 109 and 110). The method 10 will be further described according to one or more embodiments. It should be noted that the operations of the method 10 may be rearranged or otherwise modified within the scope of the various aspects. It should be further noted that additional processes may be provided before, during, and after the method 10, and that some other processes may just be briefly described herein. Thus, other implementations are possible within the scope of the various aspects described herein.

FIGS. 2 to 30 are perspective views illustrating a semiconductor structure at various fabrication stages constructed according to aspects of one or more embodiments of the present disclosure. For example, FIGS. 2 to 4 illustrate cross-sectional views of intermediate semiconductor structures 301 to 303 according to some embodiments corresponding to operation 101. In operation 101, a nanosheet stack 202 is formed over a substrate 200. The nanosheet stack 202 includes a plurality of nanosheets extending in a first direction D1. In some embodiments, the substrate 200 may be a semiconductor substrate such as a silicon substrate. The substrate 200 may also include other semiconductors such as germanium (Ge), silicon carbide (SiC), silicon germanium (SiGe), or diamond. Alternatively, the substrate 200 may include a compound semiconductor and/or an alloy semiconductor. The substrate 200 may include various layers, including conductive or insulating layers formed on a semiconductor substrate. The substrate 200 may include various doping configurations depending on design requirements as is known in the art. For example, different doping profiles (e.g., n wells or p wells) may be formed on the substrate 200 designed for different device types (e.g., n-type field effect transistors (NFET), or p-type field effect transistors (PFET)). The suitable doping may include ion implantation of dopants and/or diffusion processes.

In some embodiments, a plurality of alternating semiconductor layers 204 and 205 are formed over the substrate 200. The alternating semiconductor layers 204 and 205 may be used to selectively process some of the layers. Accordingly, compositions of the semiconductor layers 204 and 205 may have different oxidation rates, etchant sensitivity, and/or other differing properties. The semiconductor layers 204 and 205 may have thicknesses chosen based on device performance considerations. In some embodiments, the semiconductor layers 204 are substantially uniform in thickness, and the semiconductor layers 205 are substantially uniform in thickness.

In some embodiments, either of the semiconductor layers 204 and 205 may include Si. In some embodiments, either of the semiconductor layers 204 and 205 may include other materials such as Ge, a compound semiconductor such as silicon carbide (SiC), gallium arsenide (GaAs), gallium phosphide (GaP), indium phosphide (InP), indium arsenide (InAs), and/or indium antimonide (InSb), an alloy semiconductor such as SiGe, GaAsP, AlInAs, AlGaAs, InGaAs, GaInP, and/or GaInAsP, or combinations thereof. In some embodiments, the semiconductor layers 204 and 205 may be undoped or substantially dopant-free, where, for example, no doping is performed during an epitaxial growth process. Alternatively, the semiconductor layers 204 and 205 may be doped. For example, the semiconductor layers 204 or 205 may be doped with a p-type dopant such as boron (B), aluminum (Al), In, or Ga for forming a p-type channel, or an n-type dopant such as P. As, or Sb for forming an n-type channel.

Still referring to FIG. 2, the nanosheet stack 202 may be fabricated using suitable operations including photolithography and etch operations. In some embodiments, the nanosheet stack 202 is also known as a fin. In some embodiments, forming the nanosheet stack 202 may further include a trim process to decrease a width and/or a height of the nanosheet stack 202. The trim process may include wet or dry etching processes. The height and the width of the nanosheet stack 202 may be chosen based on device performance considerations. Further, the nanosheet stacks 202 can extend along a first direction D1 as shown in FIG. 2. Additionally, the nanosheet stacks 202 are arranged in a second direction D2, wherein the second direction D2 is not parallel to the first direction D1.

Referring to FIG. 3, in some embodiments, gaps between nanosheet stacks 202 are filled with a dielectric material for forming shallow trench isolations (STIs) 206 interposing the nanosheet stacks 202. In some embodiments, the STIs 206 are recessed, thereby exposing portions of sidewalls of the nanosheet stacks 202. In some embodiments, the dielectric material used to fill the gaps and to form the STIs 206 may include silicon oxide (SiO), silicon nitride (SiN), silicon oxynitride (SiON), fluorine-doped silicate glass (FSG), a low-k dielectric, combinations thereof, and/or other suitable materials known in the art.

Referring to FIG. 4, in some embodiments, a cap layer or a liner 208 is conformally formed over the nanosheet stacks 202. Accordingly, tops and the sidewalls that are exposed through the STIs 206 are covered by the cap layer 208. In some embodiments, the cap layer 208 includes dielectric materials such as SiN, SiON, silicon carbonitride (SiCN), silicon oxycarbonitride (SiOCN), or other appropriate material. In other embodiments, the cap layer 208 may include silicon germanium (SiGe).

Referring to FIG. 5, FIG. 5 is a schematic drawing of an intermediate semiconductor structure 304 according to some embodiments corresponding to operation 102. A sacrificial gate structure 210 is disposed over the nanosheet stack 202 and the substrate 200. In some embodiments, a polysilicon layer 212 is formed over the substrate 200 and the nanosheet stack 204. A patterned hard mask is formed over the polysilicon layer 212. In some embodiments, the patterned hard mask may be a patterned multiple hard mask. For example, the patterned multiple hard mask may include a first layer 213a and a second layer 213b, but the disclosure is not limited thereto. In some embodiments, the first layer 213a and the second layer 213b may include different dielectric materials. The polysilicon layer 212 is patterned through the patterned hard mask 213a/213b, thereby forming the sacrificial gate structure 210. The sacrificial gate structure 210 may be replaced at a later processing stage by a metal gate electrode (MG) as discussed below. As shown in FIG. 5, the sacrificial gate structure 210 extends along the second direction D2. Additionally, the sacrificial gate structures 210 may be arranged along the first direction D1. Each of the sacrificial gate structures 210 is at least partially disposed over the nanosheet stack 202.

In some embodiments, portions of the cap layer 208 that are exposed through the sacrificial gate structures 210 may be removed, thereby exposing the semiconductor layers 204 and 205, as shown in FIG. 5.

Figures 6, 7:
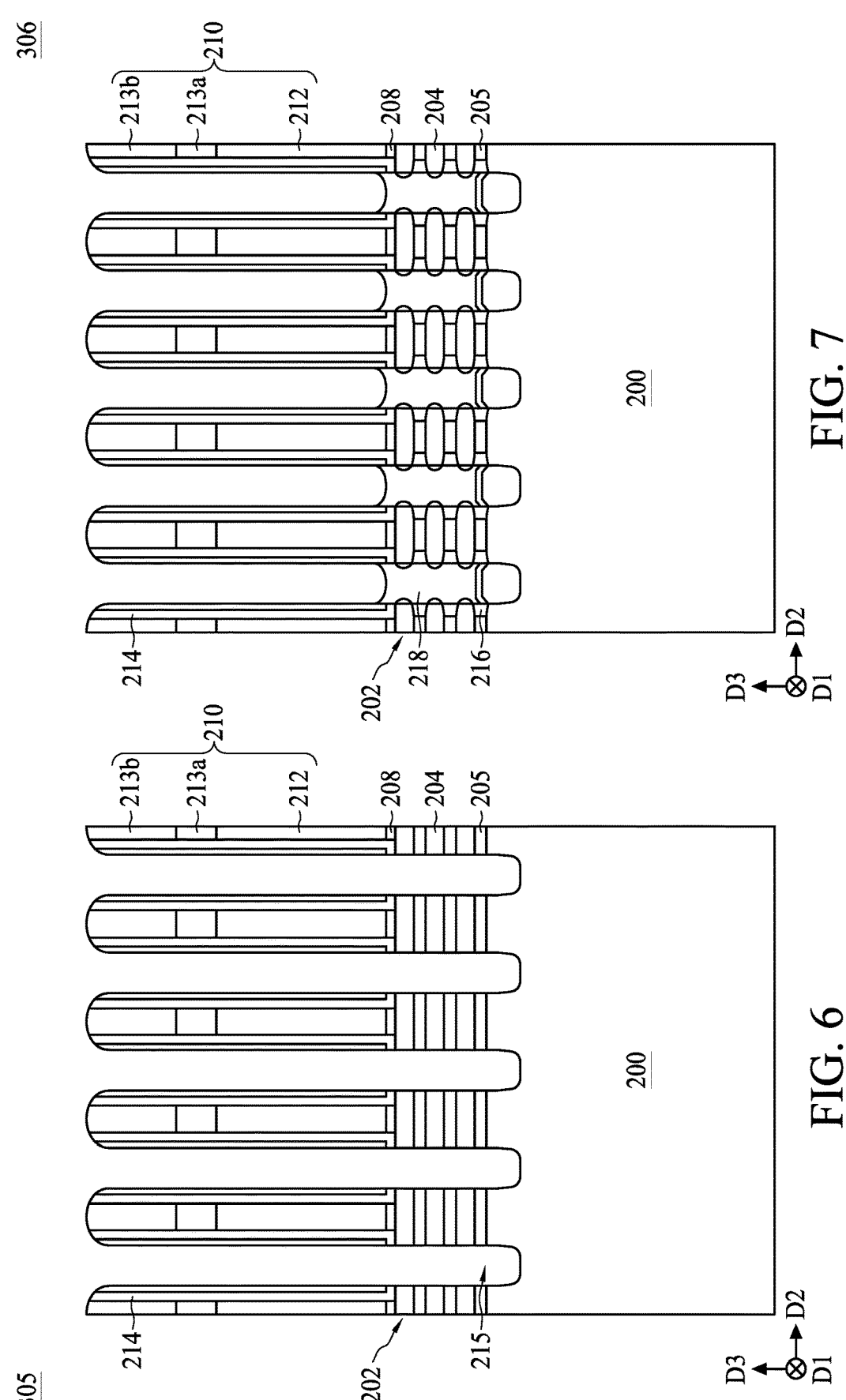
Figure 8:
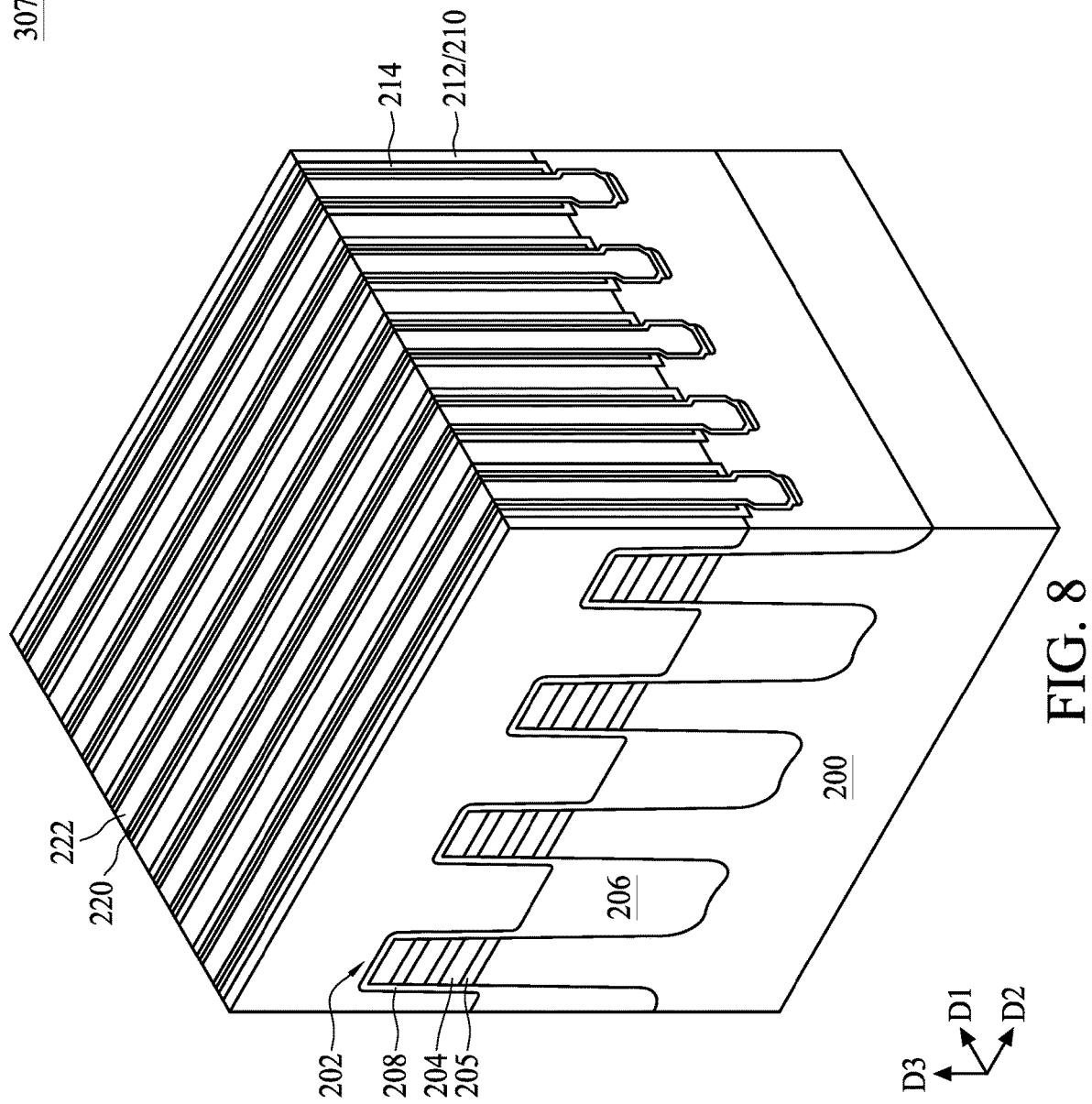
Figure 9:
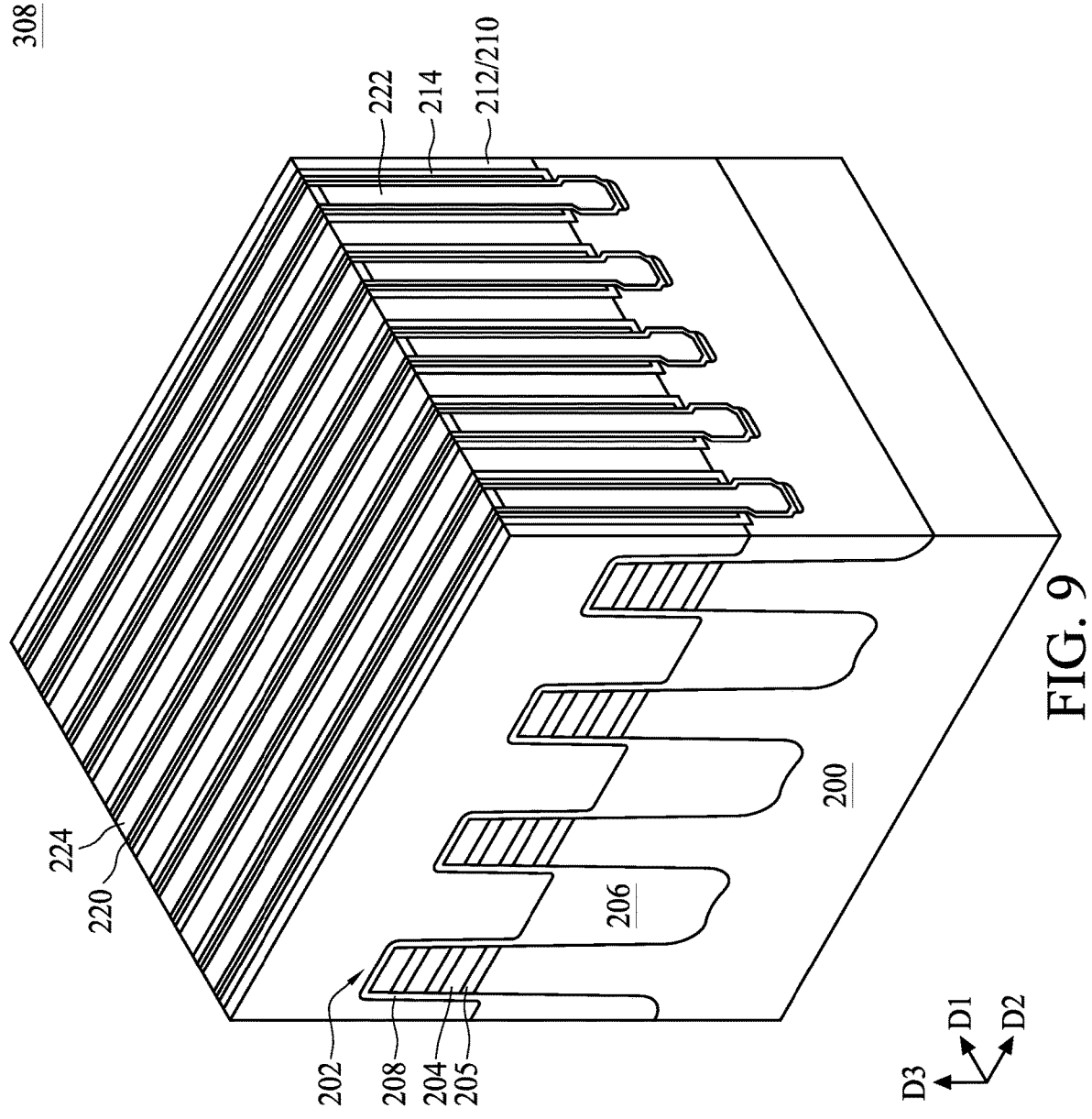
Figure 10A:
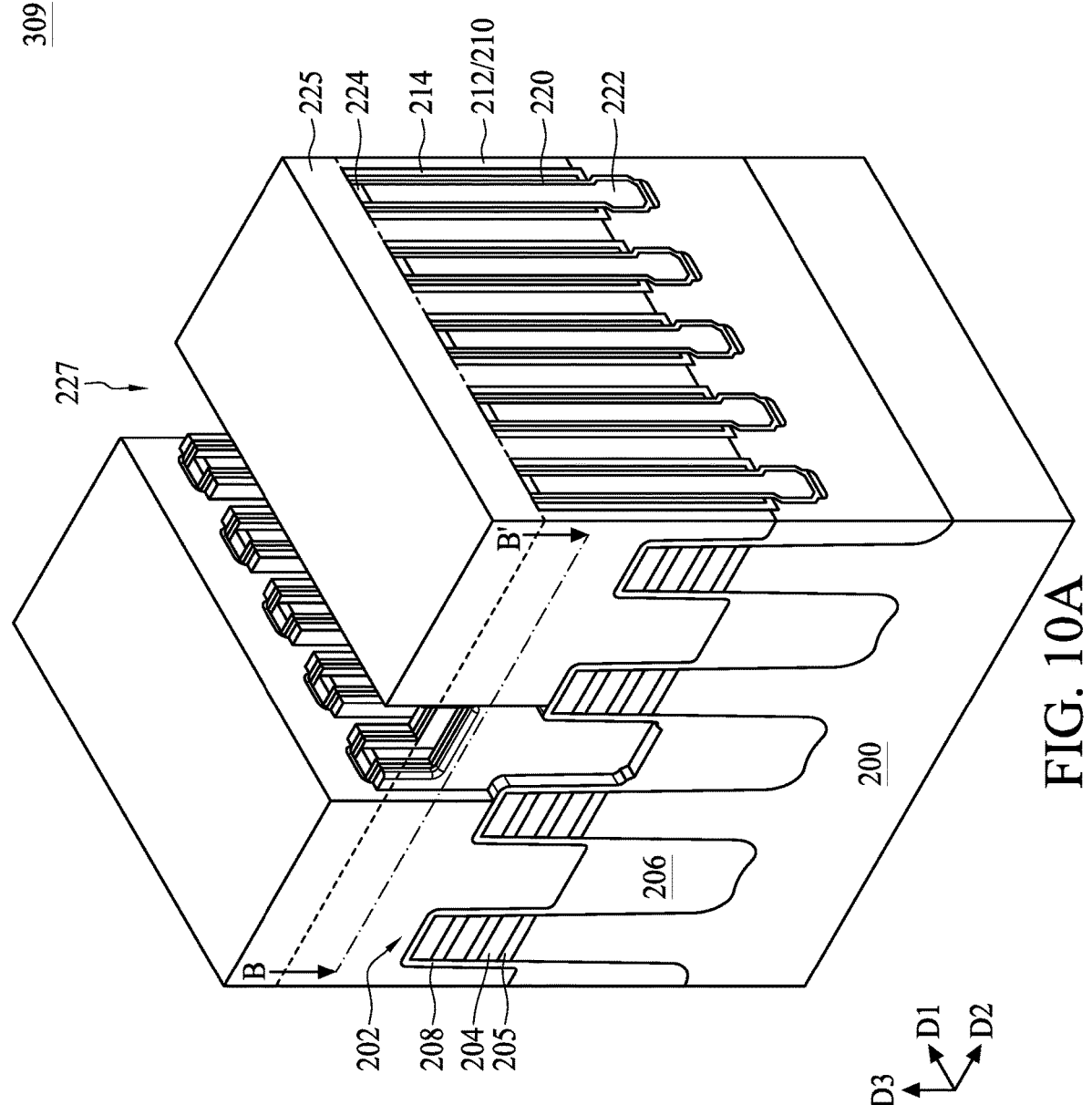
Figure 10B:
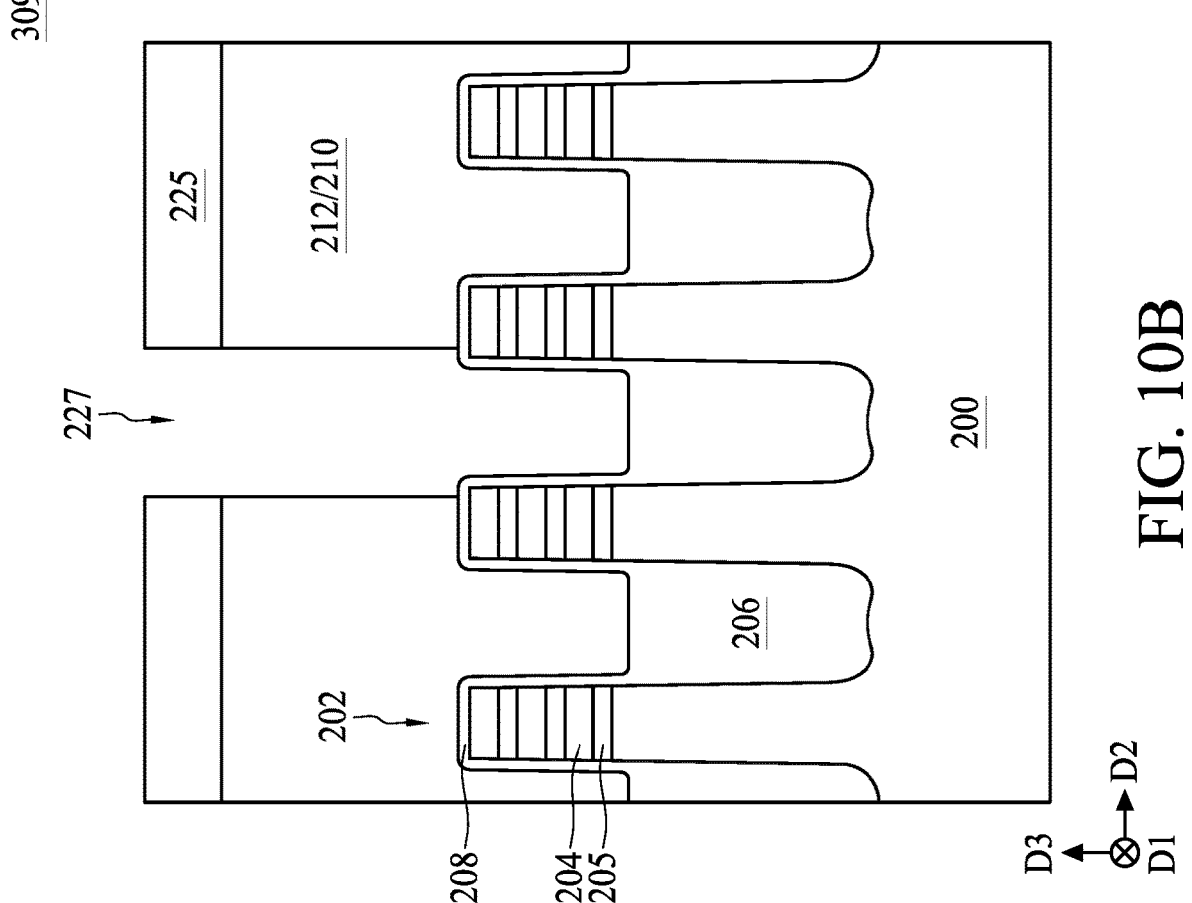

Please refer to FIGS. 6 to 9, 10A and 10B, wherein FIGS. 6, 7 and 10B are cross-sectional views of intermediate semiconductor structures 305, 306 and 309, respectively, and FIGS. 8, 9 and 10A are schematic views of intermediate semiconductor structures 307, 308 and 309 respectively. Referring to FIG. 6, in some embodiments, spacers 214 are formed over sidewalls of the sacrificial gate structures 210. In some embodiments, the spacers 214 are made of silicon nitride (SiN), silicon carbide (SiC), silicon oxide (SiO), silicon oxynitride (SiON), SiC or any suitable material, but the disclosure is not limited thereto. In some embodiments, the spacers 214 are formed by deposition and etch-back operations. Subsequently, portions of the nanosheet stack 202 exposed through the spacers 214 and the sacrificial gate structure 210 are removed, thereby forming recesses 215 interrupting the nanosheet stack 202. As shown in FIG. 6, the semiconductor layers 204 and the semiconductor layers 205 are exposed through sidewalls of the recesses 215.

Referring to FIG. 7, in some embodiments, the exposed semiconductor layers 205 of the nanosheet stack 202 are partially removed, and thus a plurality of notches (not shown) are formed between the remaining semiconductor layers 204. In some embodiments, an insulating layer is formed to fill the notches. Subsequently, portions of the insulating layer may be removed, thereby forming inner spacers 216.

Still referring to FIG. 7, in some embodiments, epitaxial source/drain structures 218 are formed at two sides of the sacrificial gate structure 210. The source/drain structures 218 may be a source or a drain, individually or collectively depending upon the context. In some embodiments, the epitaxial source/drain structures 218 can be relatively higher than the nanosheet stack 202. In some embodiments, the epitaxial source/drain structures 218 are formed by forming recesses in the nanosheet stacks 202 and growing a strained material in the recesses by an epitaxial (epi) process. In addition, a lattice constant of the strained material may be different from a lattice constant of the substrate 200. Accordingly, the epitaxial source/drain structures 218 serve as stressors that improve carrier mobility.

Referring to FIG. 8, in some embodiments, after the forming of the epitaxial source/drain structures 218, a contact etch-stop layer (CESL) 220 can be formed to cover the sacrificial gate structures 210 over the substrate 200. In some embodiments, the CESL 220 can include silicon nitride, silicon oxynitride, and/or other applicable materials. Subsequently, an inter-layer dielectric (ILD) layer 222 can be formed on the CESL 220 over the substrate 200 in accordance with some embodiments. The ILD layer 222 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), and polyimide. Next, a polishing process is performed on the ILD layer 222, the CESL 220 and the patterned hard mask 213a/213b to expose top surfaces of the polysilicon layer 212 of the sacrificial gate structures 210. In some embodiments, the ILD layer 222 and the CESL 220 are planarized by a chemical mechanical polishing (CMP) process until the top surfaces of the polysilicon layer 212 are exposed.

Referring to FIG. 9, in some embodiments, the ILD layer 222 may be consumed during the CMP process. Therefore, a dielectric layer 224 may be formed over the ILD layer 222, but the disclosure is not limited thereto. In some embodiments, the dielectric layer 224 may include materials different from those of the ILD layer 222, but the disclosure is not limited thereto.

Referring to FIGS. 10A and 10B, wherein FIG. 10B is a cross-sectional view taken along a line B-B' of FIG. 10A, a patterned hard mask 225 is formed over the substrate 200. Further, FIGS. 10A and 10B are drawings of an intermediate semiconductor structure 309 according to some embodiments corresponding to operation 103. In some embodiments, a portion of the polysilicon layer 212 is removed through the patterned hard mask 225. Accordingly, a trench 227 is formed. As shown in FIGS. 10A and 10B, the trench 227 extends in the direction D1. Further, the trench 227 is disposed between two adjacent nanosheet stacks 202. In some embodiments, the cap layer 208 is exposed through a bottom and a lower portion of a sidewall of the trench 227. In some embodiments, a portion of the polysilicon layer 212 is exposed through an upper portion of the sidewall of the trench 227.

Figure 11A:
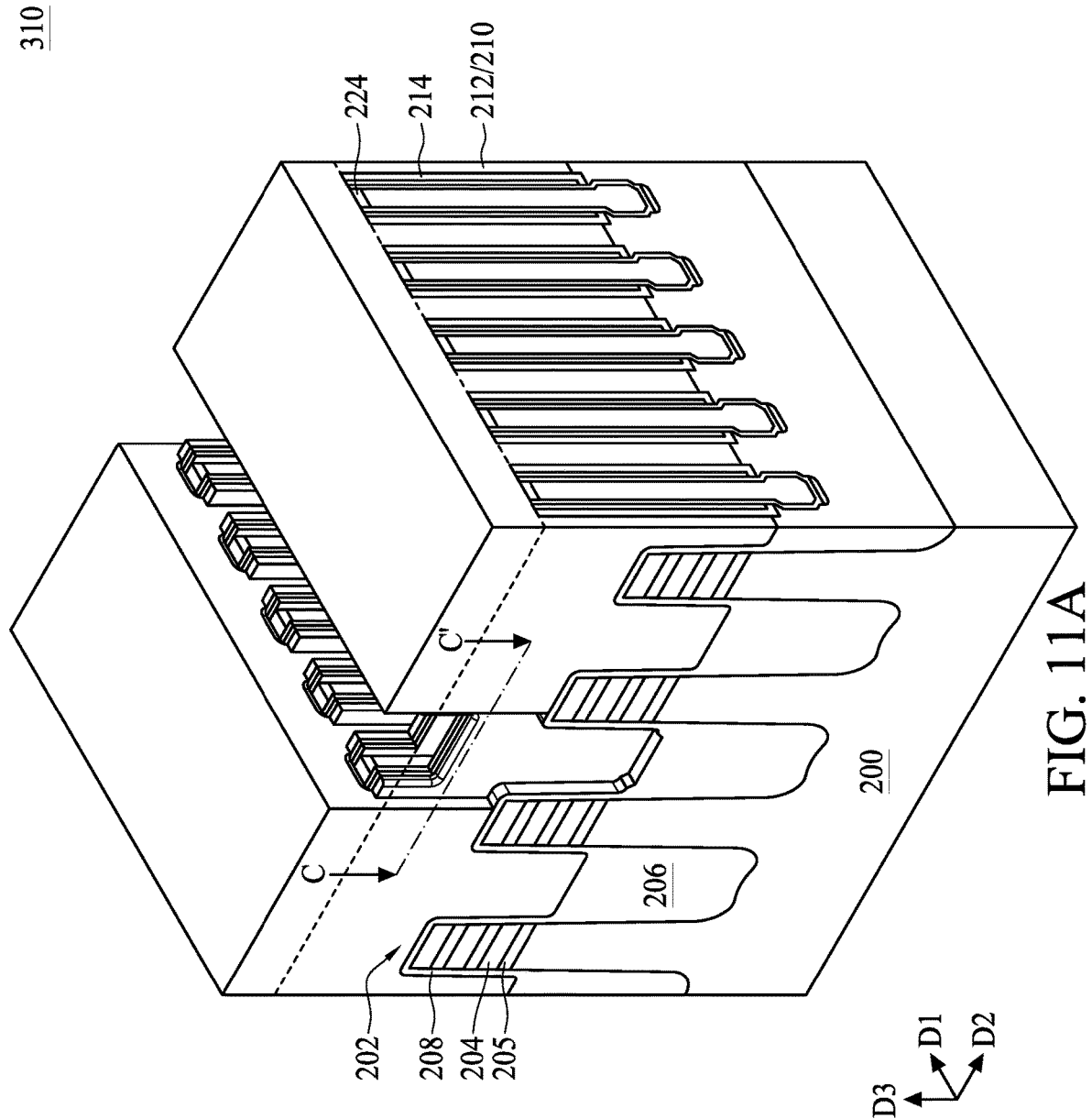
Figure 11B:
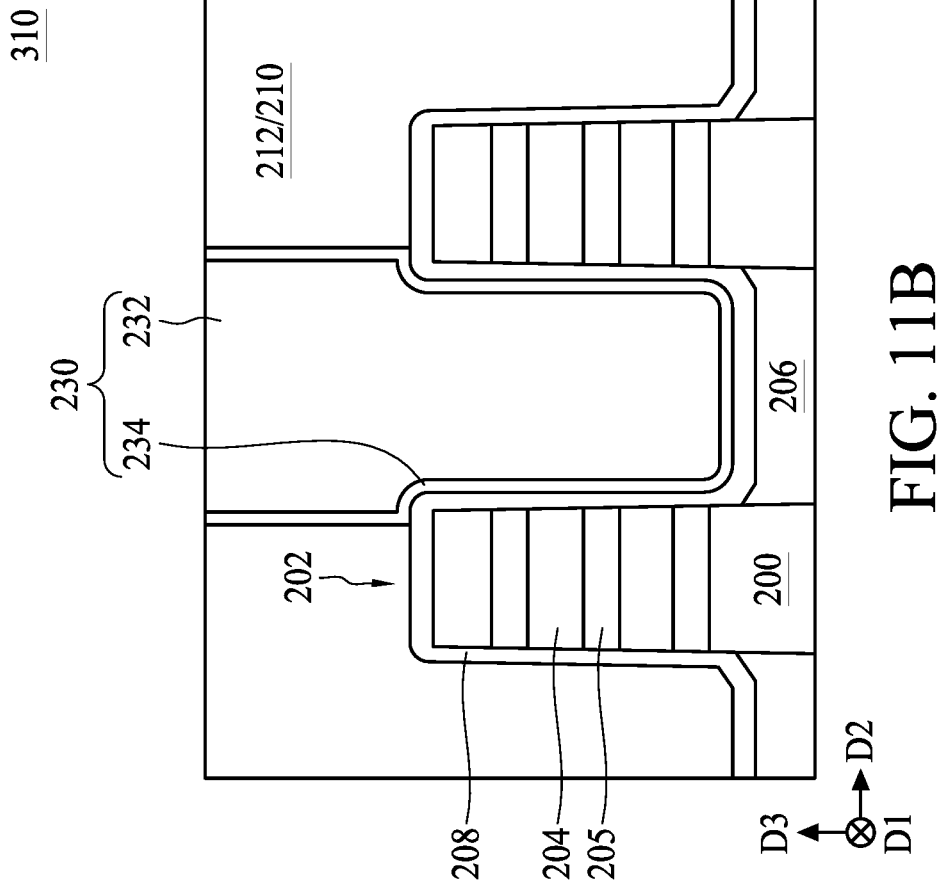

Please refer to FIGS. 11A and 11B, wherein FIG. 11B is a cross-sectional view taken along a line C-C' of FIG. 11A. Further, FIGS. 11A and 11B are drawings of an intermediate semiconductor structure 310 according to operation 104. In some embodiments, a dielectric wall 230 is formed to fill the trench 227. In some embodiments, the dielectric wall 230 may be a single-layer structure. In some embodiments, the dielectric wall 230 may be multi-layer structure. As shown in FIG. 11B, the dielectric wall 230 may be a bi-layer structure that includes a first dielectric layer 232 and a second dielectric layer 234. The second dielectric layer 234 may be disposed between the first dielectric layer 232 and the cap layer 208, and between the first dielectric layer 232 and the polysilicon layer 212. A thickness of the second dielectric layer 234 is less than a thickness of the first dielectric layer 232. The first dielectric layer 232 and the second dielectric layer 234 include different dielectric materials. In some embodiments, the first dielectric layer 232 includes low-k dielectric materials such as SiO, SiN, SiCN, SiCON, or other suitable materials. In some embodiments, the second dielectric layer 234 may be conformally formed prior to the forming of the first dielectric layer 232. Further, a CMP process may be performed after the forming of the first dielectric layer 232, thus forming a top surface of the obtained dielectric wall 230 aligned with (i.e., coplanar with) a top surface of the polysilicon layer 212. Additionally, in some embodiments, the top surface of the dielectric wall 230, the top surface of the polysilicon layer 212, and top surfaces of the dielectric layer 224 are aligned with each other.

Figures 12A, 12B:
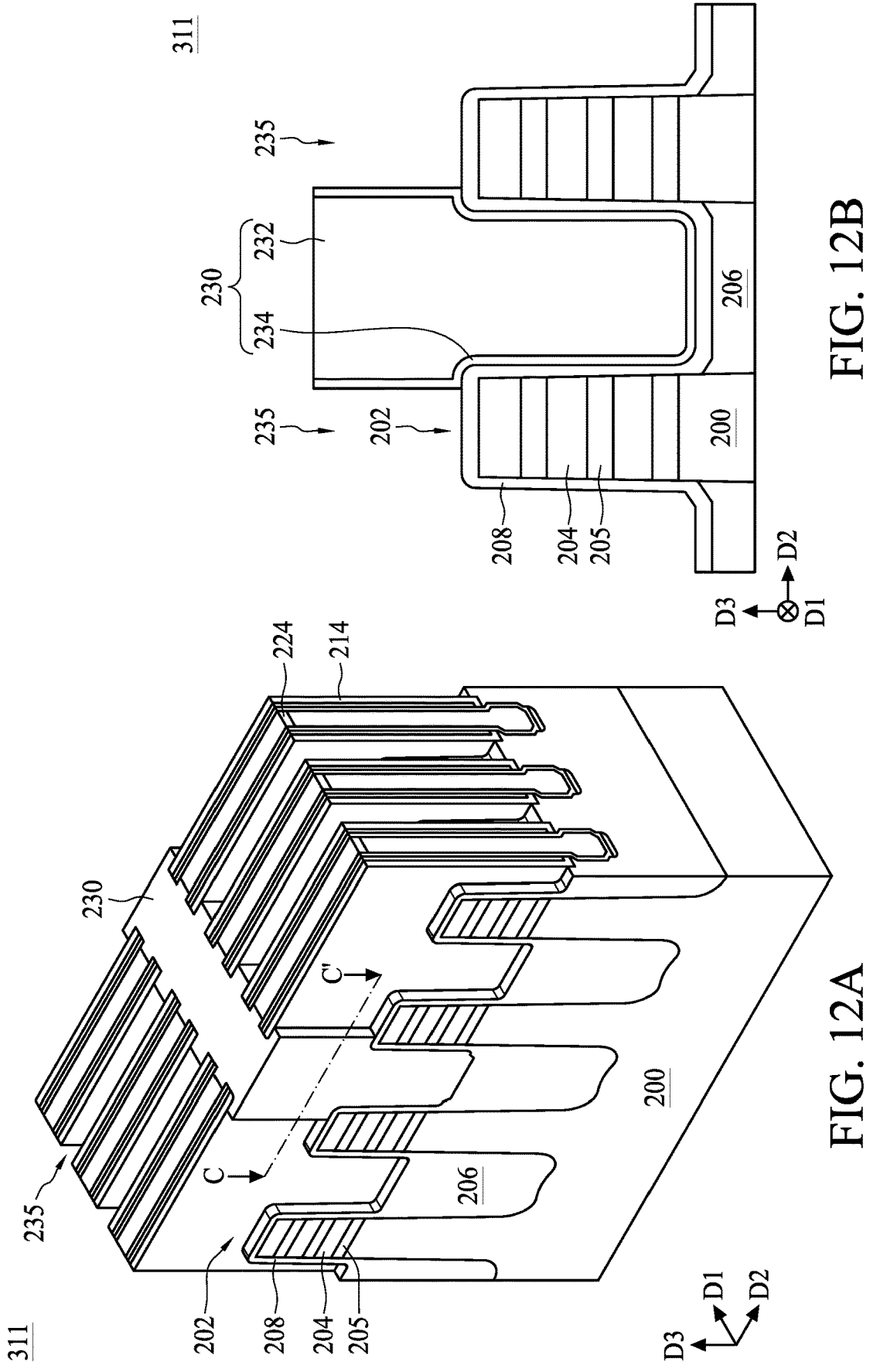

Please refer to FIGS. 12A and 12B, wherein FIG. 12B is a cross-sectional view taken along a line C-C' of FIG. 12A. Further, FIGS. 12A and 12B are drawings of an intermediate semiconductor structure 311 according to operation 105. In some embodiments, a remaining portion of the sacrificial gate structure 210 (i.e., the polysilicon layer 212) is removed to form a plurality of trenches 235. Accordingly, the cap layer 208 covering the nanosheet stacks 202 and the dielectric wall 230 are exposed through sidewalls of each trench 235.

Figure 14:
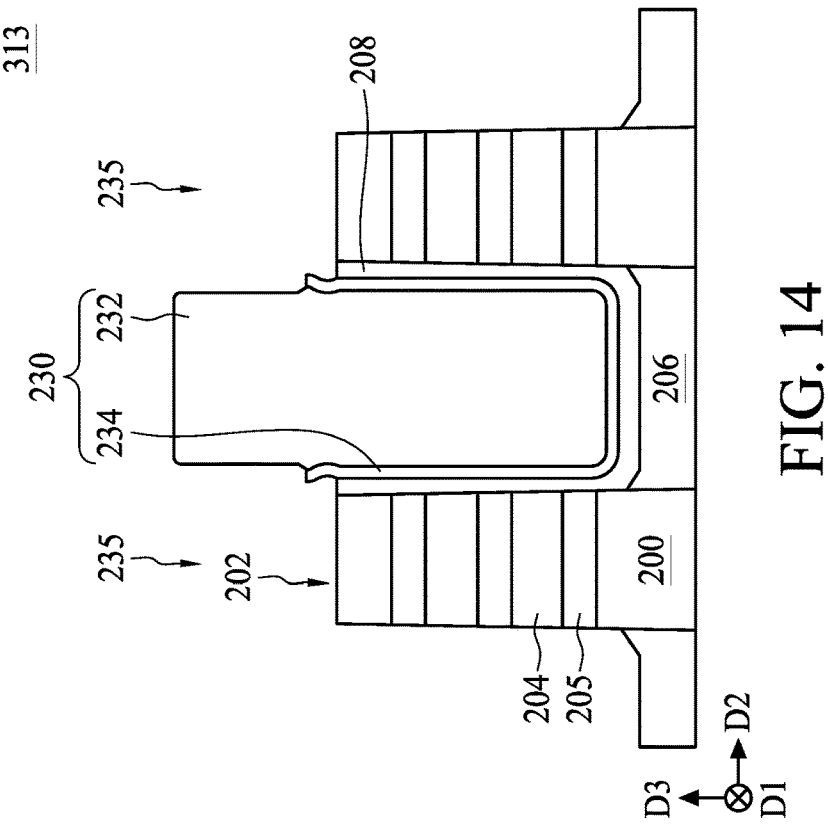
Figure 13:
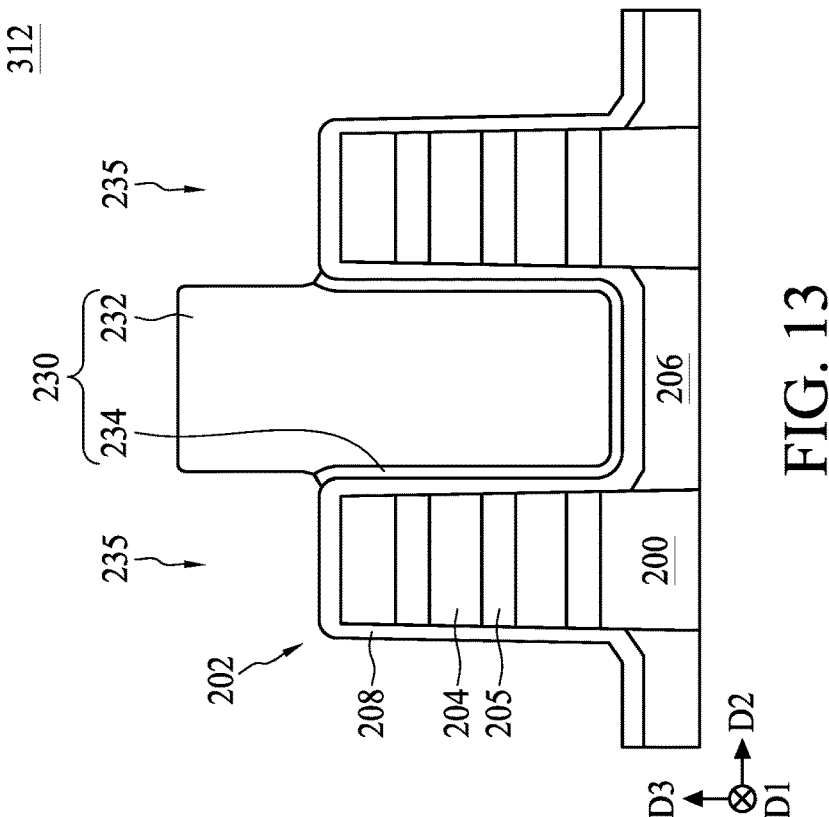

Please refer to FIGS. 13 and 14, which are schematic views at various fabrication stages subsequent to that of FIGS. 12A and 12B. Further, FIGS. 13 and 14 are cross-sectional views of intermediate semiconductor structures 312 and 313 according to some embodiments of the present disclosure. Referring to FIG. 13, in some embodiments, when the dielectric wall 230 is a multi-layer structure (i.e., a bi-layer structure), a portion of the second dielectric layer 234, which is exposed through the trenches 235, is removed, thereby exposing the first dielectric layer 232 through the sidewalls of the trenches 235. In such embodiments, another portion of the second dielectric layer 234 that is sandwiched between the first dielectric layer 232 and the cap layer 208 may be impervious, and therefore remains.

Referring to FIG. 14, in some embodiments, a portion of the cap layer 208 is removed such that the nanosheet stack 202 is exposed through the trench 235.

Please refer to FIG. 15, which is a cross-sectional view of an intermediate semiconductor structure 314 according to operation 106. In operation 106, portions of the nanosheet stack 205 are removed. In some embodiments, the semiconductor layers 205 are removed such that the semiconductor layers 204 remain and are separate from each other in the trenches 235. In some embodiments, the nanosheets 204 are coupled to the dielectric wall 230 by the cap layer 208, but the disclosure is not limited thereto.

Referring to FIG. 16, which is a cross-sectional view of an intermediate semiconductor structure 315 according to some embodiments of the present disclosure, in some embodiments, the nanosheets 204 remaining in the trenches 235 are trimmed. In such embodiments, each of the nanosheets 204 is trimmed to have a desired shape and desired dimensions (i.e., thickness and width). By adjusting the width and the thickness of the nanosheets 204, a threshold voltage (Vt) of a FET device to be formed can be adjusted to meet requirements. Further, in such embodiments, the cap layer 208 and the second dielectric layer 234 may be consumed. Accordingly, a thickness of the cap layer 208 and a thickness of the second dielectric layer 234 are reduced. In some embodiments, the nanosheets 204 are still coupled to the dielectric wall 230 by the second dielectric layer 234 and the cap layer 208, as shown in FIG. 17A. In some alternative embodiments, the cap layer 208 and the second dielectric layer 234 exposed through the trenches 235 may be entirely consumed such that the nanosheets 204 are suspended in the trenches 235 and separated from the first dielectric wall 230, as shown in FIG. 17B.

Additionally, in embodiments where the dielectric wall 230 includes the single layer structure, the nanosheets 204 may be suspended in the trenches 235 after the trimming of the nanosheets 204 and the consumption of the cap layer 208.

Figure 18:
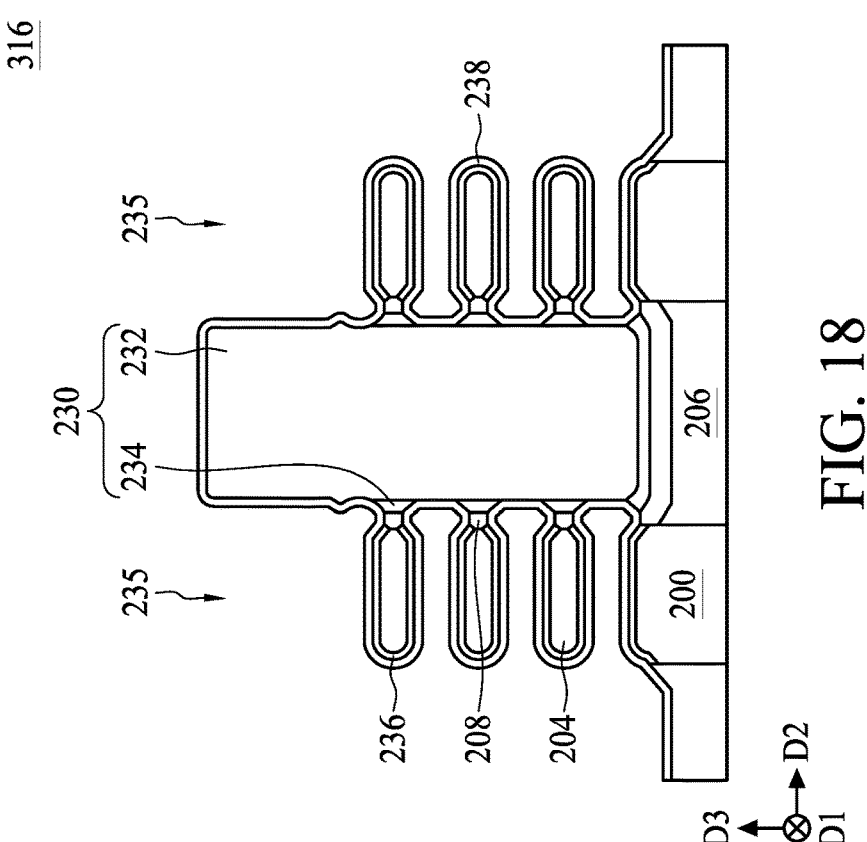

Please refer to FIG. 18, which is a cross-sectional view of an intermediate semiconductor structure 316 according to operation 107. In some embodiments, an interfacial layer (IL) 236 may be formed over each of the nanosheets 204. In operation 107, a high-k gate dielectric layer 238 is formed over the IL 236 to surround each of the nanosheets 204. In some embodiments, the high-k gate dielectric layer 238 includes a high-k dielectric material having a high dielectric constant, for example, a dielectric constant greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride (HfOxNy), other suitable metal-oxides, or combinations thereof.

In some embodiments, a metal layer may be formed over the substrate to cover the high-k gate dielectric layer 238. A diffusion may occur such that ions may diffuse from the metal layer to the high-k gate dielectric layer 238. In such embodiments, a work function of the high-k gate dielectric layer 238 may be adjusted. In such embodiments, such metal layer may be removed after the diffusion.

Figure 19:
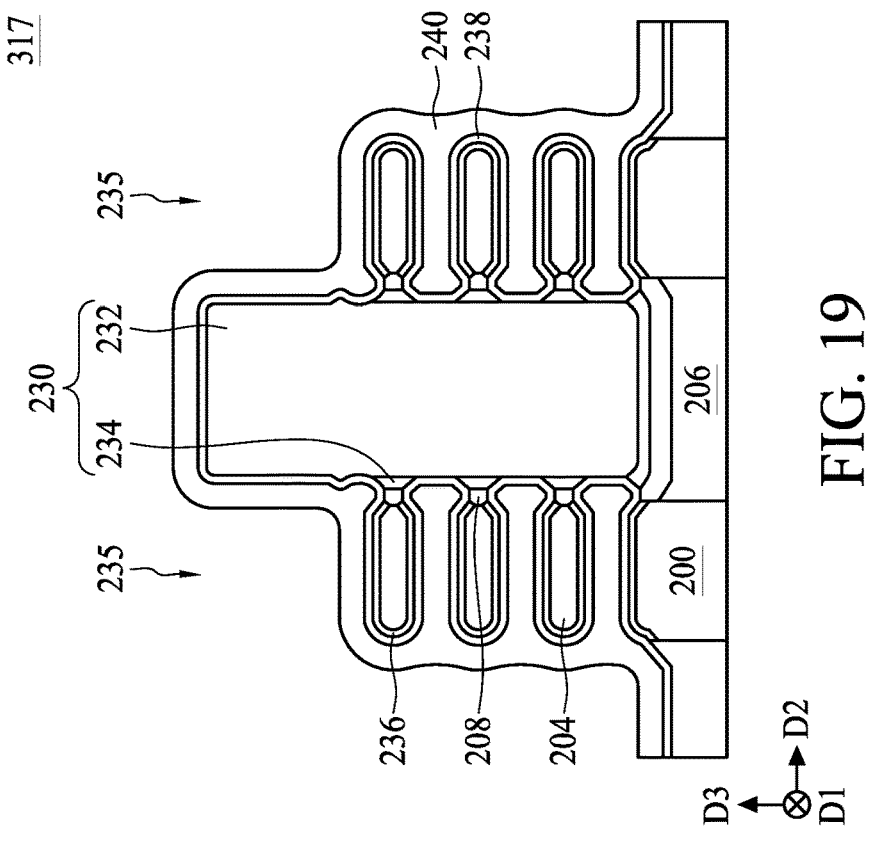

Please refer to FIG. 19, which is a cross-sectional view of an intermediate semiconductor structure 317 according to some embodiments of the present disclosure. In some embodiments, a metal layer 240 may be formed over the substrate 200. The metal layer 240 is formed to surround each of the nanosheets 204. Further, the metal layer 240 is formed on the high-k gate dielectric layer 238. In some embodiments, by selecting a metal material and adjusting a thickness of the metal layer 240, Vt of the FET device can be adjusted. In some embodiments, the metal layer 240 and the high-k gate dielectric layer 238 having the diffused ions work together to meet a Vt requirement. In some embodiments, the metal layer 240 can include a single layer or a multilayer of two or more of the selected materials. In some embodiments, at least a barrier metal layer (not shown) may be formed prior to or after the forming of the metal layer 240.

Figure 20:
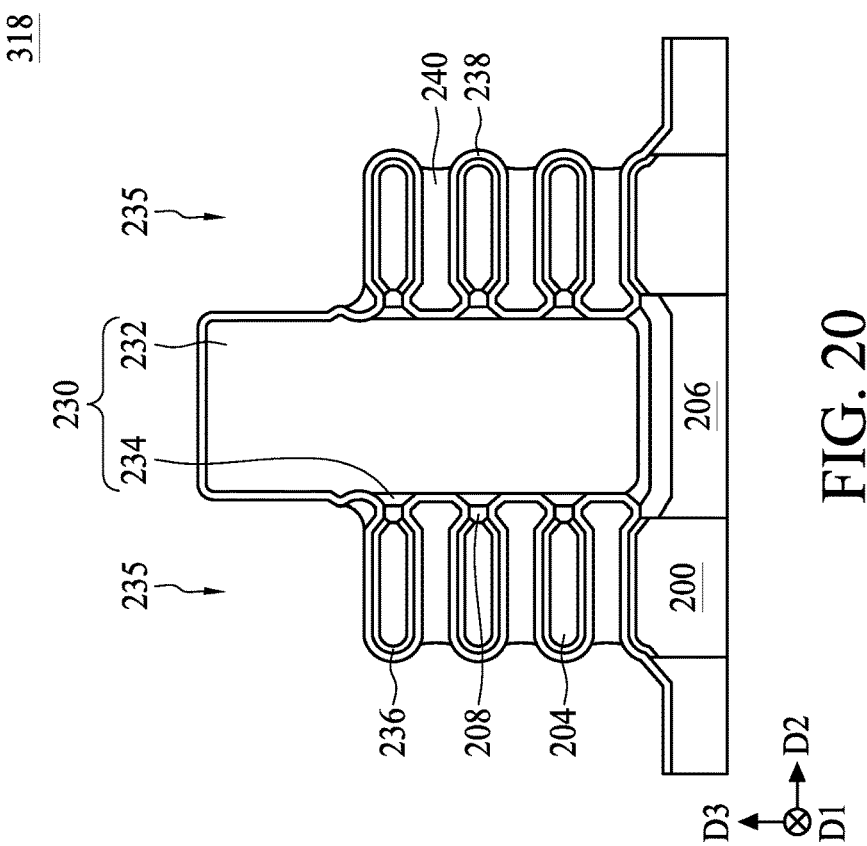

Please refer to FIG. 20, which is a cross-sectional view of an intermediate semiconductor structure 318 according to some embodiments of the present disclosure. In some embodiments, a pull back operation is performed on the metal layer 240. Accordingly, portions of the metal layer 240 are removed. In some embodiments, the metal layer 240 remains between the nanosheets 206, but the disclosure is not limited thereto.

Figure 21:
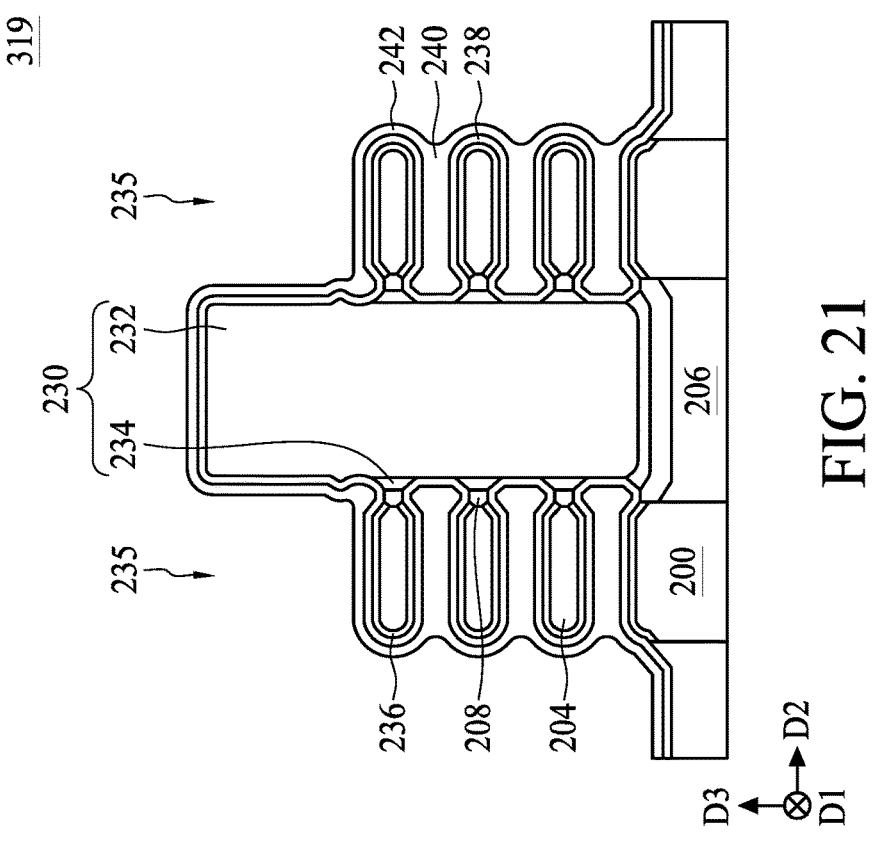

Please refer to FIG. 21, which is a cross-sectional view of an intermediate semiconductor structure 319 according to operation 107. In operation 107, a metal layer 242 is formed. In some embodiments, the metal layer 242 may include a metal material that has low resistance, but the disclosure is not limited thereto. In some embodiments, the metal layer 242 is conformally formed over the nanosheets 204 and is in contact with the metal layer 240 between the nanosheets 204. Accordingly, the metal layer 240 and the metal layer 242 form a continuous structure that surrounds all the nanosheets 204. Further, the metal layer 242 covers the dielectric wall 230, as shown in FIG. 21.

Figures 22A, 22B:
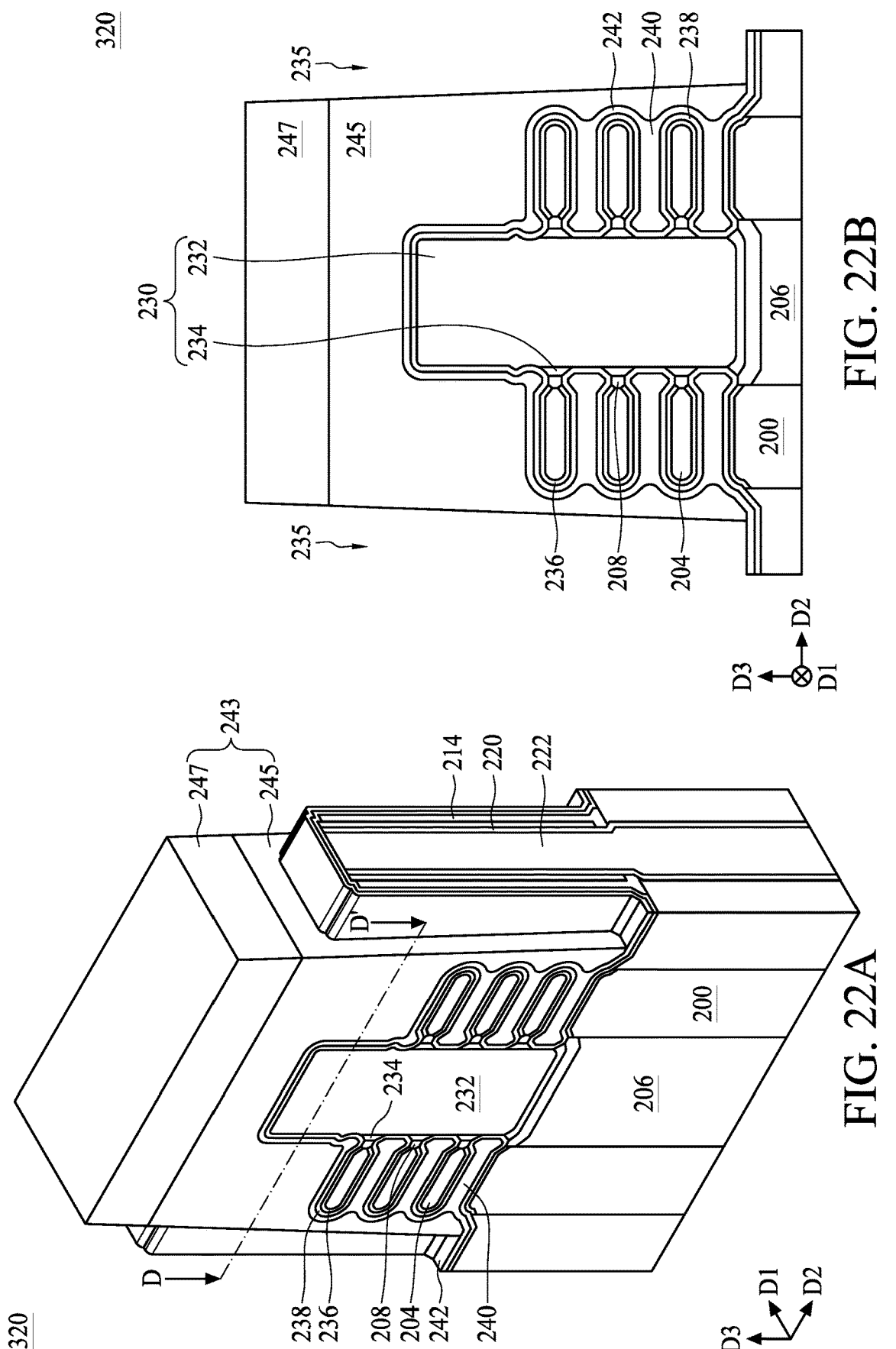

Please refer to FIGS. 22A and 22B, which are schematic views of an intermediate semiconductor structure 320 according to some embodiments of the present disclosure. Further, FIG. 22B is a cross-sectional view taken along a line D-D' of FIG. 22A. In some embodiments, a protection structure 243 is formed in the trench 235. The protection structure 243 may include a first patterned layer 245 and a second patterned layer 247. The protection structure 243 may cover the dielectric wall 230 and the nanosheets 204 at two sides of the dielectric wall 230. In such embodiments, the trench 235 is partially filled, and portions of the metal layer 242 may be exposed though a bottom of the trenches 235.

Figures 23A, 23B:
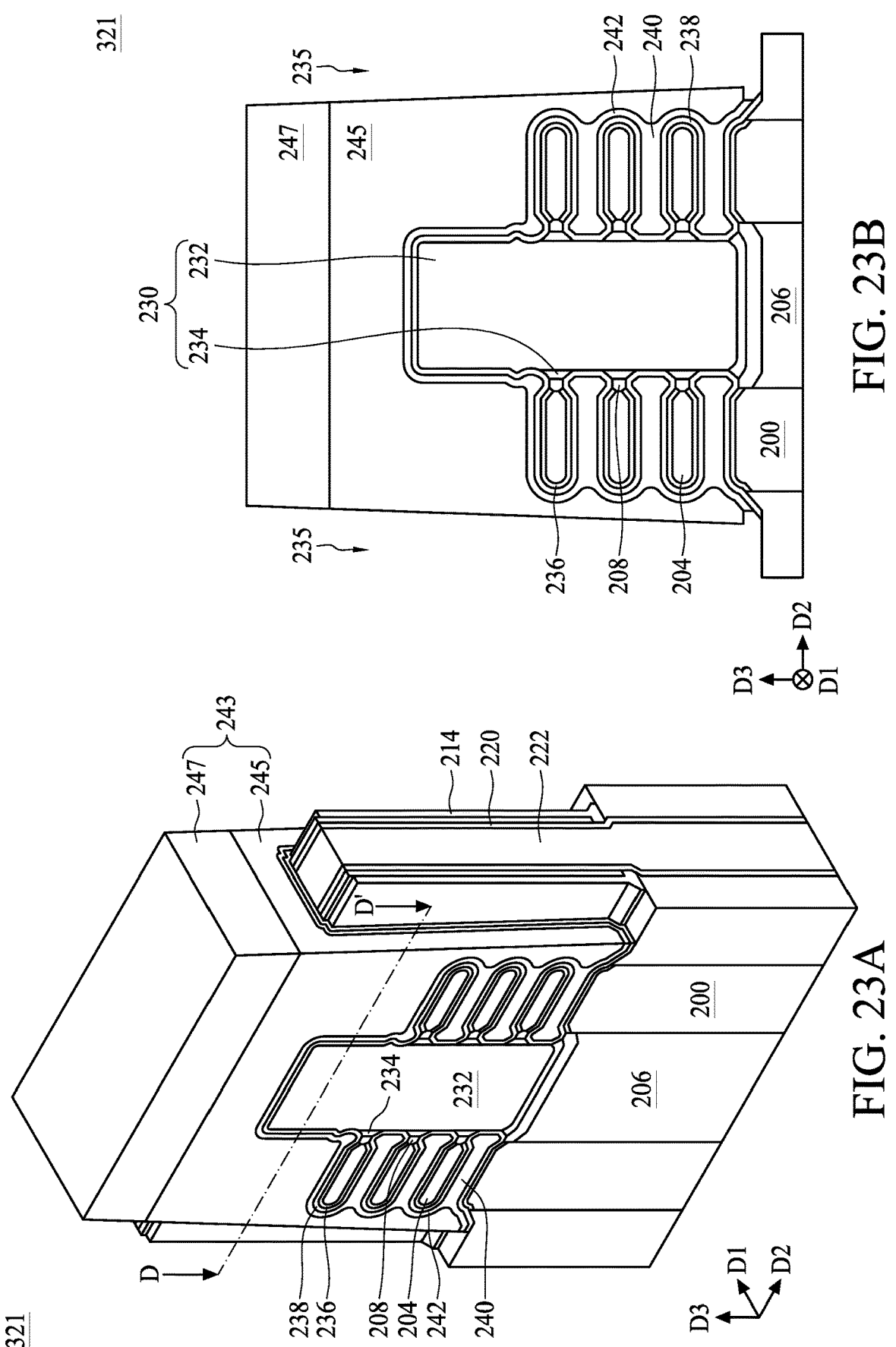

Please refer to FIGS. 23A and 23B, which are schematic views of an intermediate semiconductor structure 321 according to some embodiments of the present disclosure. Further, FIG. 23B is a cross-sectional view taken along a line D-D' of FIG. 23A. Subsequently, portions of the high-k gate dielectric layer 238 are removed. In such embodiments, the STIs 206 may be exposed through a bottom of the trenches 235.

Figures 24A, 24B:
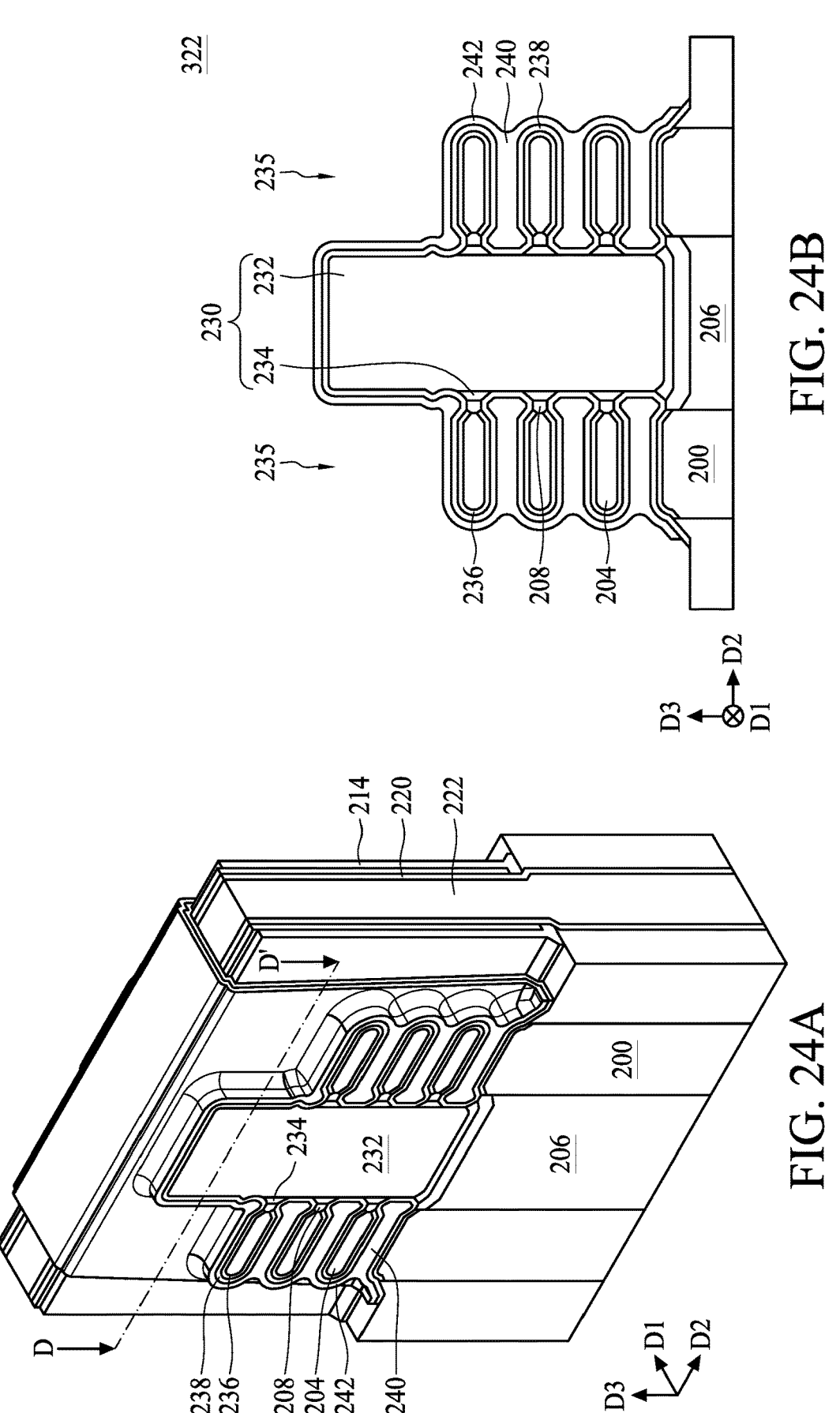

Please refer to FIGS. 24A and 24B, which are schematic views of an intermediate semiconductor structure 322 according to some embodiments of the present disclosure. Further, FIG. 24B is a cross-sectional view taken along a line D-D' of FIG. 24A. In some embodiments, after the removal of the portions of the metal layer 242 and the portions of the high-k gate dielectric layer 238, the protection structure 243 (i.e., the patterned first and second layers 245 and 247) is removed. Thus, a portion of the metal layer 242 covering the nanosheets 204 and the dielectric wall 230 remains in the trenches 235.

Figures 25A, 25B:
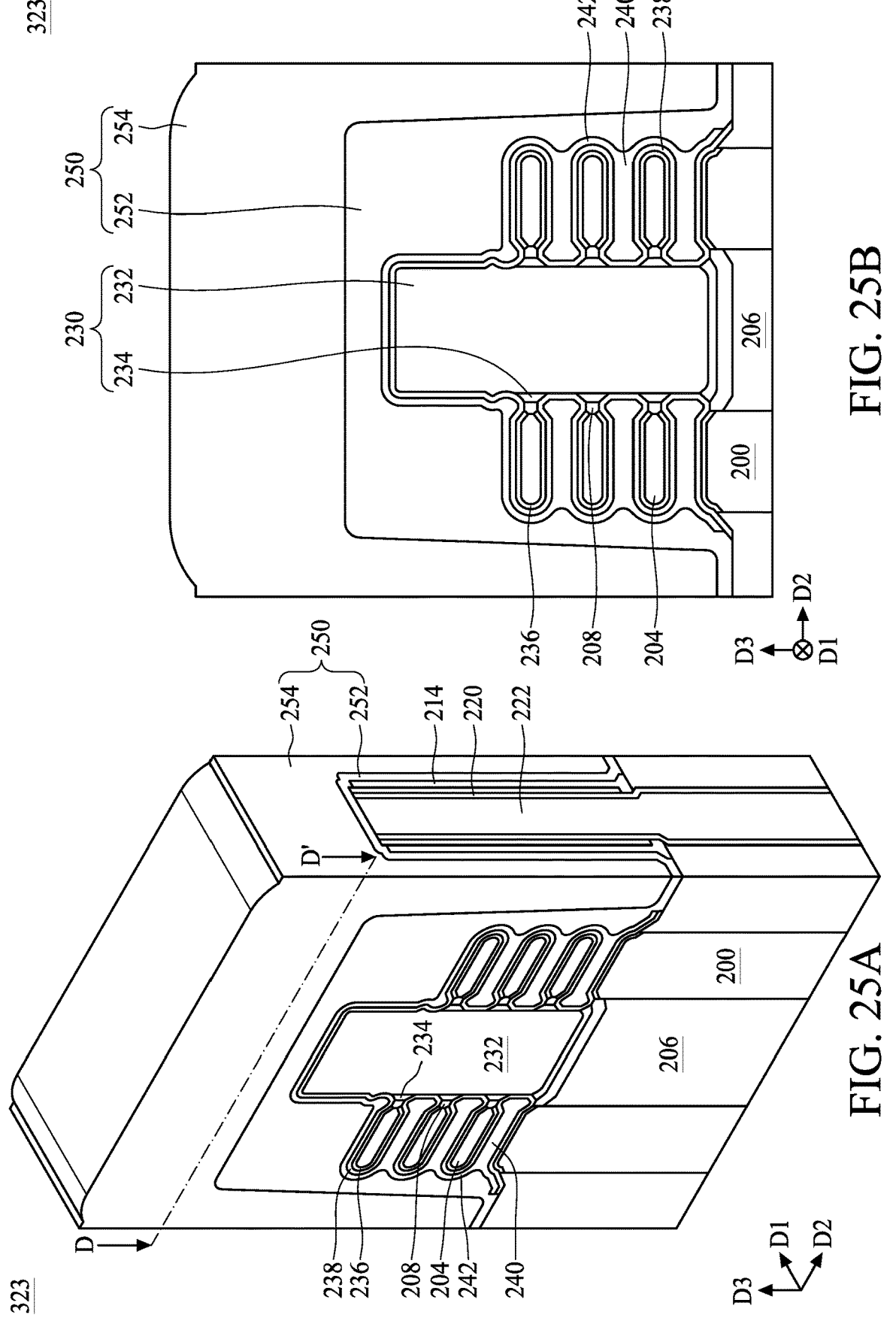
Figures 26A, 26B:
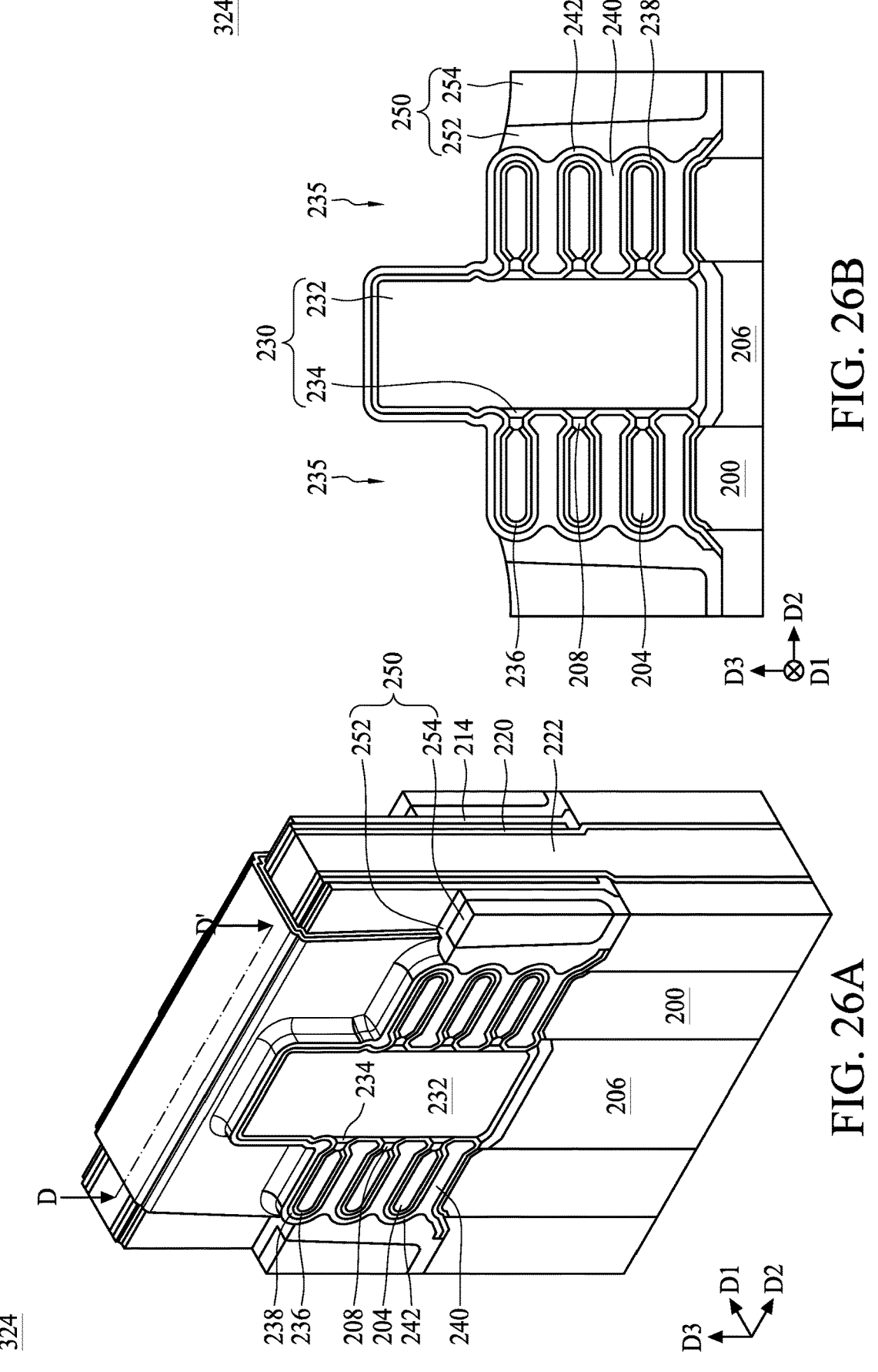

Please refer to FIGS. 25A, 25B, 26A and 26B, which are cross-sectional view of intermediate semiconductor structures 323 and 324 according to operation 108. Further, FIGS. 25B and 26B are cross-sectional views taken along a line D-D' of FIGS. 25A and 26A. Referring to FIGS. 25A and

25B, in some embodiments, a dielectric wall 250 is formed to fill the trenches 235. In some embodiments, the dielectric wall 250 includes a first dielectric layer 252 and a second dielectric layer 254 sequentially formed over the substrate 200. The first dielectric layer 252 and the second dielectric layer 254 include different materials. For example, the first dielectric layer 252 may include silicon oxide, and the second dielectric layer 254 may include silicon nitride, but the disclosure is not limited thereto. In some embodiments, the first dielectric layer 252 is formed to cover the dielectric wall 230, the metal layer 242 and the STIs 206 exposed through the trenches 235. The second dielectric layer 254 is then formed to fill the trench 235, as shown in FIGS. 25A and 25B.

Referring to FIGS. 26A and 26B, in some embodiments, another etch-back operation is performed. The etch-back operation is performed on the dielectric wall 250. Accordingly, a top surface of the first dielectric layer 252 and a top surface of the second dielectric layer 254 are lower than or level with a top surface of the topmost nanosheet 204. In such embodiments, trenches 255 are formed, and the dielectric wall 230 protrudes into the trenches 255.

Figures 27A, 27B:
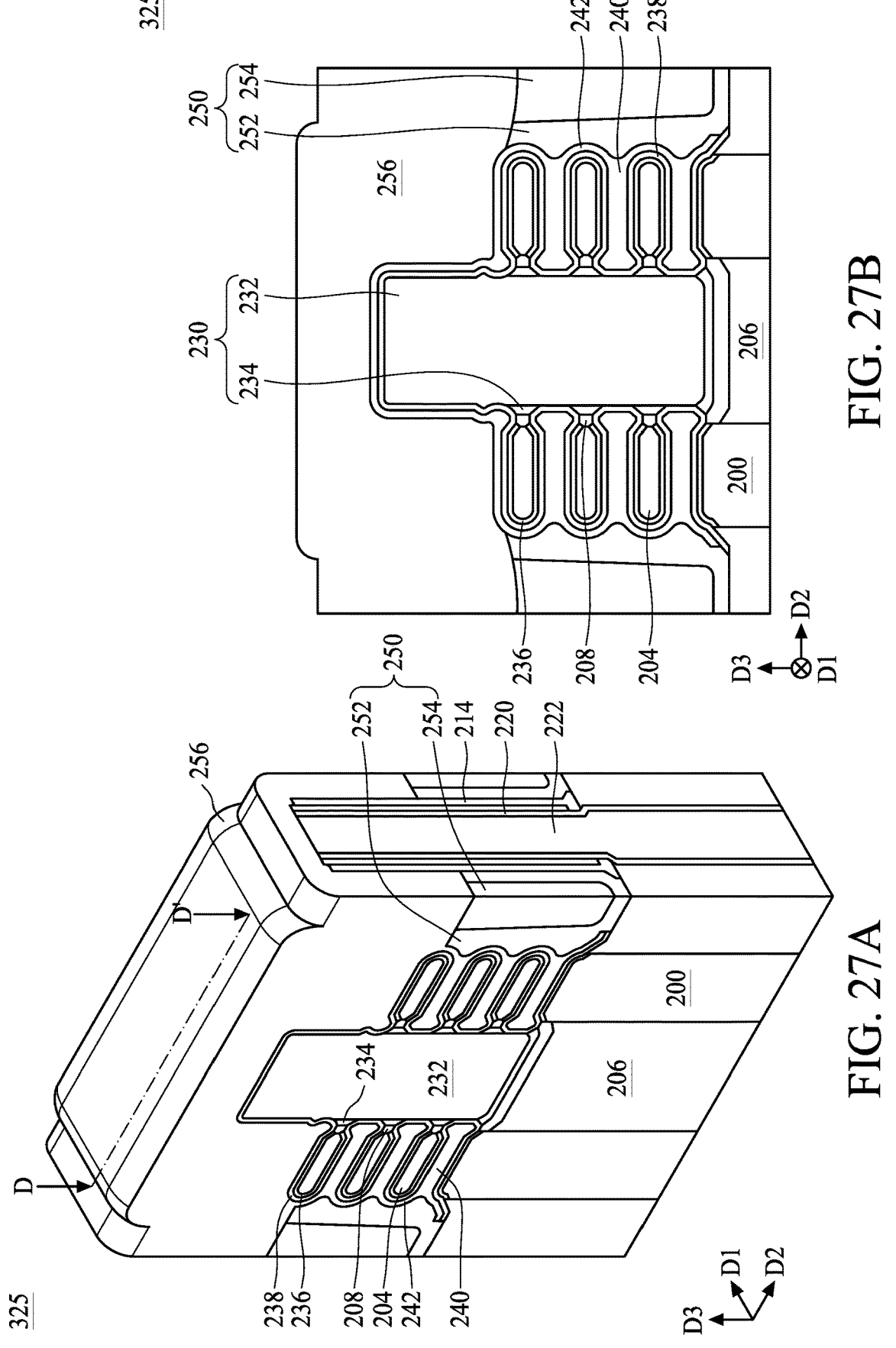
Figures 28A, 28B:
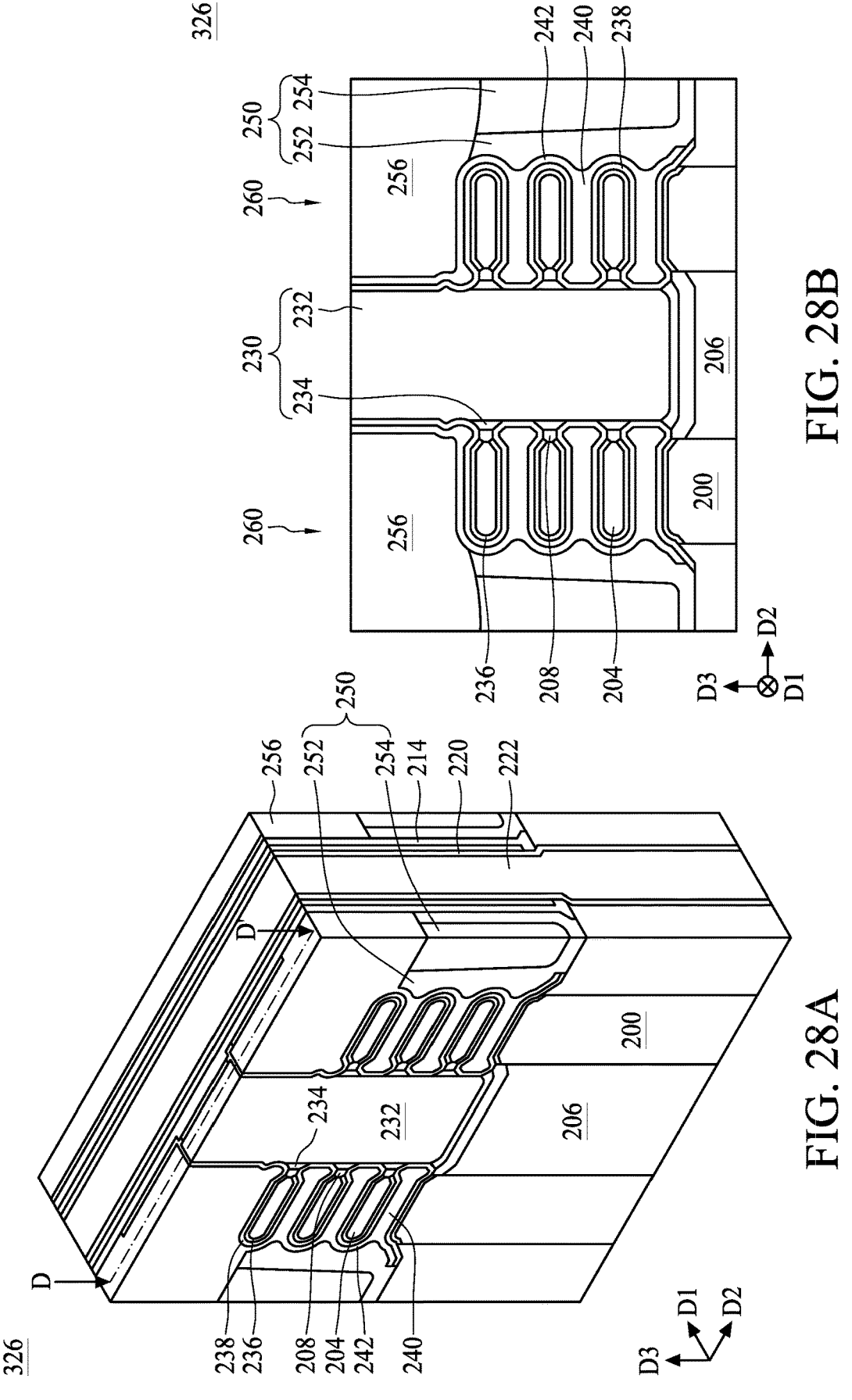

Please refer to FIGS. 27A, 27B, 28A and 28B, which are cross-sectional view of intermediate semiconductor structures 325 and 326 according to operation 109. Further, FIGS. 27B and 28B are cross-sectional views taken along a line D-D' of FIGS. 27A and 28A. Referring to FIGS. 27A and 27B, in some embodiments, a metal layer 256 is formed to fill the trenches 255. In some embodiments, the metal layer 256 and the metal layer 242 may include a same material, but the disclosure is not limited thereto. In some embodiments, the metal layer 256 is in contact with the metal layer 242 exposed through the trenches 255. Further, the metal layer 256 covers the dielectric wall 230. In some embodiments, the metal layer 256 straddles the dielectric wall 230 and serves as a gap-filling metal layer.

Referring to FIGS. 28A and 28B, in some embodiments, a CMP process may be performed to remove superfluous portion of the metal layer 256 and expose a top surface of the dielectric wall 230. In such embodiments, metal gate structures 260 are formed. In some embodiments, each metal gate structure 260 includes the nanosheets 204, the IL 236, the high-k gate dielectric layer 238, and the metal layers 240, 242 and 256. Further, the metal gate structures 260 are separated from each other by the dielectric wall 230.

Figure 29:
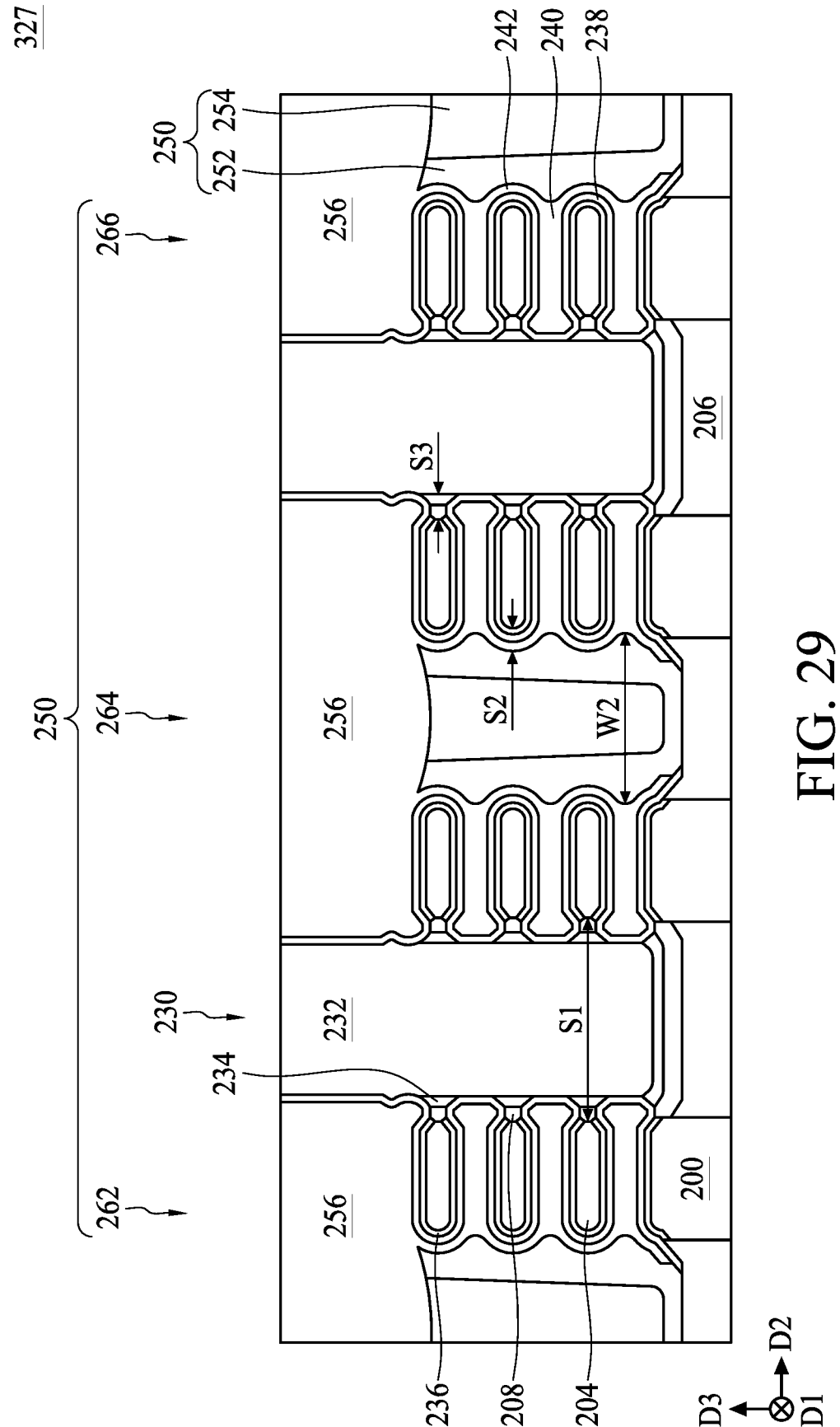

Referring to FIG. 29, FIG. 29 is a schematic drawing showing a semiconductor structure 327. In some embodiments, the semiconductor structure 327 includes the dielectric walls 230 over the substrate 200, and metal gate structures 260 (i.e., the metal gate structures 262, 264 and 266). The metal gate structures 262 and 264 are disposed at two sides of the dielectric wall 230. Each of the metal gate structures 262 and 264 includes the plurality of nanosheets 204 stacked over the substrate 200 and separated from each other, the high-k gate dielectric layer 238 covering each of the nanosheets 204, and the metal layers 240, 242 and 256 covering the plurality of nanosheets 204 and the high-k gate dielectric layer 238. Further, the high-k gate dielectric layer 238 is disposed between the metal layers 240, 242 and 256 and the dielectric wall 230. In other words, the high-k gate dielectric layer 238 separates the metal layers 240, 242 and 256 from the dielectric wall 230.

In some embodiments, the semiconductor structure 327 further includes the dielectric wall 250. In such embodiments, the plurality of nanosheets 204 of each metal gate structure 262, 264 and 266 are disposed between the dielectric wall 230 and the dielectric wall 250. A portion of the metal gate structure 262, such as the metal layer 256 of the metal gate structure 262, is disposed over the dielectric wall 250. The metal layer 256 may be in contact with a top surface of the dielectric wall 250. In some embodiments, the dielectric walls 230 and the dielectric walls 250 extend in the first direction D1. Further, the dielectric walls 230 and the dielectric walls 250 are alternately arranged. In some embodiments, the metal gate structures 262 and 266 are line symmetrical about the dielectric wall 230. In some embodiments, the metal gate structure 264 and the dielectric wall 250 are line symmetrical.

Still referring to FIG. 29, a height of the dielectric wall 230 is greater than a height of the dielectric wall 250. In some embodiments, the height of the dielectric wall 230 is substantially equal to a height of the metal gate structures 262, 264 and 266. In some embodiments, a top surface of the dielectric wall 250 is level with or lower than a top surface of a topmost nanosheet 204. In such embodiments, a distance between the top surface of the dielectric wall 250 and the top surface of the topmost nanosheet 204 is between approximately 0 nanometer and approximately 6 nanometers. In some embodiments, the height of the dielectric wall 250 is between approximately 10 nanometers and approximately 50 nanometers.

In some embodiments, a width of the dielectric wall 230 and a width of the dielectric wall 250 may be equal, but the disclosure is not limited thereto. In some embodiments, the width of the dielectric wall 230 and the width of the dielectric wall 250 may be between approximately 25 nanometers and approximately 50 nanometers, but the disclosure is not limited thereto. In some embodiments, a distance S1 between two corresponding nanosheets 204 at two sides of the dielectric wall 230 is equal to or greater than the width of the width of the dielectric wall 230. In some embodiments, the distance S1 refers to a distance between two adjacent active regions, that is, an OD-to-OD distance.

In some embodiments, the plurality of nanosheets 204 of each metal gate structure 262, 264 and 266 are coupled to the dielectric wall 230. In some alternative embodiments, the plurality of nanosheets 204 of each metal gate structure 262, 264 and 266 are separated from the dielectric wall 230. A distance S2 between the dielectric wall 250 and an end of each nanosheet 204 is between approximately 2 nanometers and approximately 12 nanometers, and a distance S3 between the dielectric wall 230 and another end of each nanosheet 204 is between approximately 1 nanometer and approximately 5 nanometers.

Figure 30:
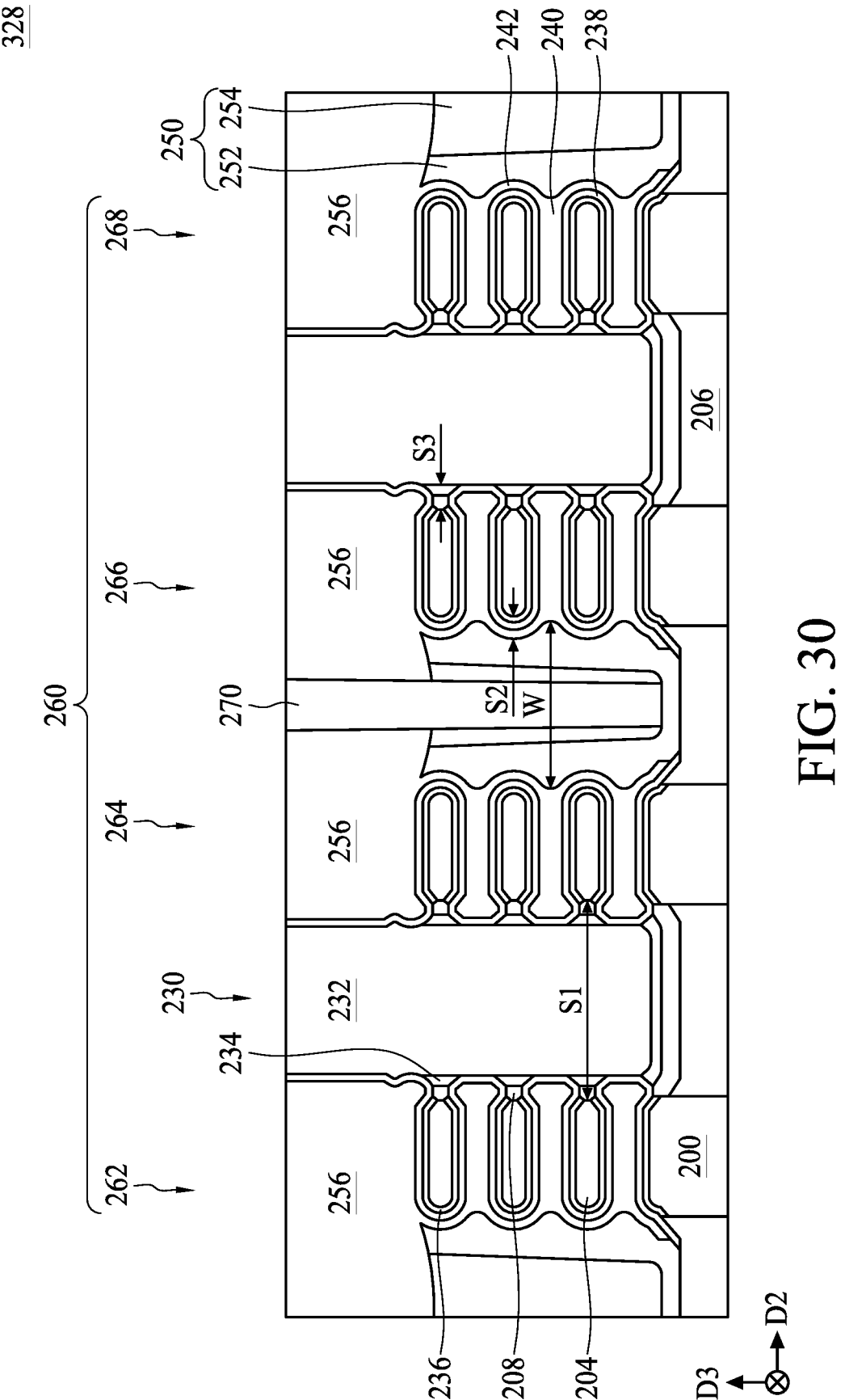

Please refer to FIG. 30, which is a cross-sectional view of a semiconductor structure 328 according to operation 110. In operation 110, a dielectric wall 270 is formed to separate the metal layer 256 and penetrate the dielectric wall 250. In some embodiments, another CMG isolation may be formed. In such embodiments, the dielectric wall 270 is formed using a photolithography process. The dielectric wall 270 may penetrate the dielectric wall 250 and cut the metal layer 256 into two parts. Accordingly metal gate structures 262, 264, 266 and 268 are obtained as shown in FIG. 30. The metal gate structure 262 is separated from the metal gate structure 264 by the dielectric wall 230, the metal gate structure 264 is separated from the metal gate structure 266 by the dielectric wall 270, and the metal gate structure 266 is separated from the metal gate structure 268 by the dielectric wall 230.

A height of the dielectric wall 270 may be equal to the heights of the metal gate structures 262, 264, 266 and 268, and may be equal to the height of the dielectric wall 230. The height of the dielectric wall 270 is greater than the height of the dielectric wall 250, and a width of the dielectric wall 270 is less than the width W of the dielectric wall 250. In some embodiments, the dielectric wall 270 includes low-dielectric materials such as SiO, SiB, SiCN, SiCON, etc. In such embodiments, the distances S1, S2, S3, the heights of the dielectric walls 230 and 250, and the widths of the dielectric walls 230 and 250 are similar to those described above; therefore, such details are omitted for brevity.

In some embodiments, the metal gate structure 262, the dielectric walls 230, the metal gate structure 264, the dielectric wall 250, the metal gate structure 266, and the metal gate structure 268 are line symmetrical about the dielectric wall 270, but the disclosure is not limited thereto.

In such embodiments, an overlay shift issue of the photolithography process that is used to form the dielectric wall 270 may be mitigate because the dielectric wall 250 serves as a buffer.

Referring to FIGS. 29 and 30, in some embodiments, the nanosheets 204 may be coupled to the dielectric wall 230, and thus the semiconductor structures utilize a pi-gate scheme. In other embodiments, the nanosheets 204 may be separated from the dielectric wall 230, and thus the semiconductor structures utilize a GAA scheme. In some embodiments, the pi-gate scheme may reduce an AC penalty, while the GAA scheme may have better short channel effect (SCE) control. Accordingly, the semiconductor structures can be designed to utilize the pi-gate scheme or the GAA scheme depending on different product requirements.

The present disclosure therefore provides a semiconductor structure and a method for forming the same. In some embodiments, the method includes providing dielectric walls that separates metal gate structures prior to forming of metal gate structures. In some embodiments, the dielectric walls form a CMG region. In some embodiments, the dielectric walls formed by the method help to mitigate issues of overlay shift and variation in CD. Accordingly, a cell height may be scaled down by approximately 65% to 75%.

According to one embodiment of the present disclosure, a semiconductor structure is provided. The semiconductor structure includes a first dielectric wall over a substrate, and two metal gate structures disposed at two sides of the first dielectric wall. Each of the metal gate structures includes a plurality of nanosheets stacked over the substrate and separated from each other, a high-k gate dielectric layer covering each of the nanosheets, and a metal layer covering over the plurality of nanosheets and the high-k gate dielectric layer. The high-k gate dielectric layer of each metal gate structure is disposed between the metal layer of each metal gate structure and the first dielectric wall.

According to one embodiment of the present disclosure, a semiconductor structure is provided. The semiconductor structure includes a first dielectric wall, a second dielectric wall disposed in the second dielectric wall, a pair of first metal gate structures, a pair of third dielectric walls, and a pair of second metal gate structures. The first dielectric wall and the second dielectric wall are disposed between the pair of first metal gate structures. The first dielectric wall, the second dielectric wall, and the pair of first metal gate structure are disposed between the pair of third dielectric walls. The pair of third dielectric walls, the pair of first metal gate structures, the first dielectric wall and the second dielectric wall are disposed between the pair of second metal gate structures.

According to one embodiment of the present disclosure, a method for forming a semiconductor structure is provided. The method includes following operations. A nanosheet stack is formed over a substrate. The nanosheet stack includes a plurality of nanosheets extending in a first direction. A sacrificial gate structure is formed over the nanosheet stack and extending in a second direction. A portion of the sacrificial gate structures are removed to form a first trench extending in the first direction. A first dielectric wall is formed in the first trench. A remaining portion of the sacrificial gate structure is removed to form a plurality of second trenches extending in the second direction. The nanosheet stack is exposed through the second trenches. Portions of the nanosheet stack are removed to form a plurality of nanosheets separated from each other. A high-k gate dielectric layer and a first metal layer are formed in the second trenches. A second dielectric wall is formed in the second trenches. A second metal layer is formed over the second dielectric wall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a nanosheet stack over a substrate, wherein the nanosheet stack comprises a plurality of nanosheets extending in a first direction;
   forming a sacrificial gate structure over the nanosheet stack and extending in a second direction;
   removing a portion of the sacrificial gate structure to form a first trench extending in the first direction;
   forming a first dielectric wall in the first trench;
   removing a remaining portion of the sacrificial gate structure to form a plurality of second trenches extending in the second direction, wherein the nanosheet stack is exposed through the second trenches;
   removing portions of the nanosheet stack to form a plurality of nanosheets separated from each other;
   forming a high-k gate dielectric layer and a first metal layer in the second trenches;
   forming a second dielectric wall in the second trenches; and
   forming a second metal layer over the second dielectric wall.

2. The method of claim 1, further comprising:
   forming a third metal layer to fill spaces between the nanosheets and cover the high-k gate dielectric layer; and
   removing a portion of the third metal layer to exposed a portion of the high-k gate dielectric layer.

3. The method of claim 1, wherein the high-k gate dielectric layer and the first metal layer cover portions of sidewalls and a top surface of the first dielectric wall.

4. The method of claim 1, further comprising:
   forming a protection structure over the first dielectric wall, the nanosheets, a portion of the first metal layer and a portion of the high-k gate dielectric layer;

removing a portion of the first metal layer exposed through the protection structure and a portion of the high-k gate dielectric layer exposed through the protection structure; and
   removing the protection structure.

5. The method of claim 1, wherein the forming of the second dielectric wall further comprises:
   forming a first dielectric layer and a second dielectric layer over the first dielectric wall and the nanosheets; and
   removing a portion of the first dielectric layer and a portion of the second dielectric layer such that a top surface of the first dielectric layer and a top surface of the second dielectric layer are level with or lower than a top surface of a topmost nanosheet.

6. The method of claim 5, further comprising forming a third dielectric wall to separate the second dielectric layer and penetrate the second dielectric wall.

7. A method for forming a semiconductor structure, comprising:
   forming a nanosheet stack extending in a first direction;
   forming a sacrificial gate structure over the nanosheet stack and extending in a second direction;
   replacing a portion of the sacrificial gate structure with a first dielectric wall, wherein the first dielectric wall extends in the first direction;
   removing a remaining portion of the sacrificial gate structure to form a plurality of first trenches extending in the second direction, wherein the nanosheet stack is exposed through the first trenches;
   removing portions of the nanosheet stack to form a plurality of nanosheets separated from each other;
   forming a high-k gate dielectric layer and a first metal layer in the first trenches;
   forming a second dielectric wall in the first trenches; and
   forming a second metal layer over the second dielectric wall,
   wherein a top surface of the second metal layer is aligned with a top surface of the first dielectric wall.

8. The method of claim 7, wherein the replacement of the portion of the sacrificial gate structure with the first dielectric wall comprises:
   removing the portion of the sacrificial gate structure to form a second trench extending in the first direction; and
   forming the first dielectric wall in the second trench.

9. The method of claim 8, wherein formation of the first dielectric wall further comprises:
   forming a first dielectric layer to line a bottom and sidewalls of the second trench; and
   forming a second dielectric layer to fill the second trench.

10. The method of claim 9, wherein a thickness of the first dielectric layer is less than a thickness of the second dielectric layer.

11. The method of claim 9, further comprising removing a portion of the first dielectric layer such that a portion of sidewalls of the second dielectric layer is exposed through the first trench.

12. The method of claim 9, further comprising a liner disposed between the first dielectric layer and the nanosheet stack.

13. The method of claim 9, further comprising removing portions of the first dielectric layer after the formation of the plurality of nanosheets.

14. The method of claim 7, wherein the high-k gate dielectric layer covers sidewalls of the first dielectric wall.

15. The method of claim 7, further comprising forming a third dielectric wall in the second metal layer and the second dielectric wall, wherein a top surface of the third dielectric wall is aligned with the top surface of the first dielectric wall and the top surface of the second metal layer.

16. A method for forming a semiconductor structure, comprising:

forming a nanosheet stack extending in a first direction;

forming a sacrificial gate structure over the nanosheet stack and extending in a second direction;

replacing a portion of the sacrificial gate structure with a first dielectric wall, wherein the first dielectric wall extends in the first direction;

removing a remaining portion of the sacrificial gate structure to form a plurality of first trenches extending in the second direction, wherein the nanosheet stack is exposed through the first trenches;

removing portions of the nanosheet stack to form a plurality of nanosheets separated from each other;

forming a high-k gate dielectric layer and a first metal layer in the first trenches;

forming a first dielectric layer and a second dielectric layer over the first dielectric wall and the nanosheets; and removing a portion of the first dielectric layer and a portion of the second dielectric layer to form a second dielectric wall, wherein a top surface of the second dielectric wall is lower than a top surface of the first dielectric wall.

17. The method of claim 16, wherein the top surface of the second dielectric wall is level with or lower than a top surface of a topmost nanosheet.

18. The method of claim 16, further comprising forming a second metal layer over the top surface of the second dielectric wall.

19. The method of claim 18, wherein a top surface of the second metal layer is aligned with the top surface of the first dielectric wall.

20. The method of claim 16, further comprising forming a third dielectric wall to separate the second dielectric layer and penetrate the second dielectric wall.

* * * * *